(12) United States Patent
Rabkin et al.

(10) Patent No.: US 9,711,229 B1
(45) Date of Patent: Jul. 18, 2017

(54) 3D NAND WITH PARTIAL BLOCK ERASE

(71) Applicant: SANDISK TECHNOLOGIES LLC, Plano, TX (US)

(72) Inventors: Peter Rabkin, Cupertino, CA (US); Masaaki Higashitani, Cupertino, CA (US)

(73) Assignee: SANDISK TECHNOLOGIES LLC, Plano, TX (US)

(*) Notice: Subject to any disclaimer, the term of this patent is extended or adjusted under 35 U.S.C. 154(b) by 0 days.

(21) Appl. No.: 15/246,510

(22) Filed: Aug. 24, 2016

(51) Int. Cl.
| | | |
|---|---|---|
| *G11C 16/16* | (2006.01) | |
| *G11C 16/04* | (2006.01) | |
| *G11C 16/08* | (2006.01) | |
| *H01L 27/115* | (2017.01) | |
| *G11C 16/10* | (2006.01) | |

(52) U.S. Cl.
CPC .......... *G11C 16/16* (2013.01); *G11C 16/0483* (2013.01); *G11C 16/08* (2013.01); *G11C 16/10* (2013.01); *H01L 27/115* (2013.01)

(58) Field of Classification Search
CPC .... G11C 16/0483; G11C 16/10; H01L 27/115
USPC .......................... 365/185.17, 185.01, 185.05
See application file for complete search history.

(56) References Cited

U.S. PATENT DOCUMENTS

| | | | |
|---|---|---|---|
| 8,897,070 B2 | 11/2014 | Dong | |
| 9,036,428 B1 | 5/2015 | d'Abreu | |
| 9,286,989 B2 | 3/2016 | D'Abreu | |
| 9,287,290 B1 | 3/2016 | Rabkin | |
| 2013/0107628 A1 | 5/2013 | Dong | |
| 2013/0272069 A1* | 10/2013 | Rabkin | ............... H01L 29/6675 365/185.17 |

* cited by examiner

*Primary Examiner* — Jason Lappas
(74) *Attorney, Agent, or Firm* — Vierra Magen Marcus LLP

(57) ABSTRACT

Systems and methods for performing a partial block erase operation on a portion of a memory array are described. The memory array may include a plurality of vertical NAND strings in which a first set of the plurality of vertical NAND strings are connected to a first drain-side select line, a second set of the plurality of vertical NAND strings are connected to a second drain-side select line, and both the first set and the second set of vertical NAND strings are connected to one or more shared word lines. In cases where a first vertical NAND string of the first set and a second vertical NAND string of the second set are both connected to selected bit lines and the same shared word line, selectivity of memory cells may be provided by applying different voltages to the first drain-side select line and the second drain-side select line.

19 Claims, 16 Drawing Sheets

FIG. 2

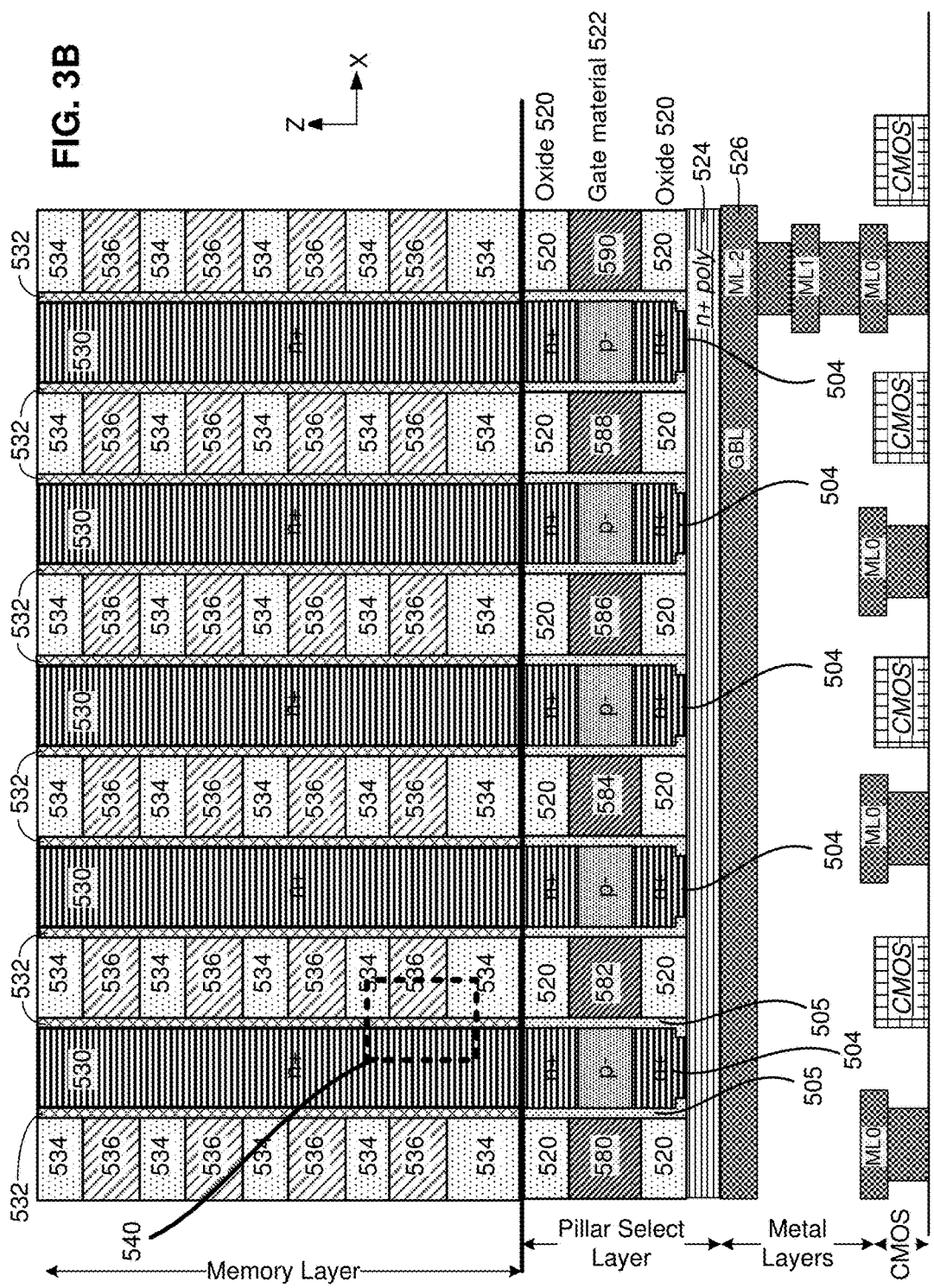

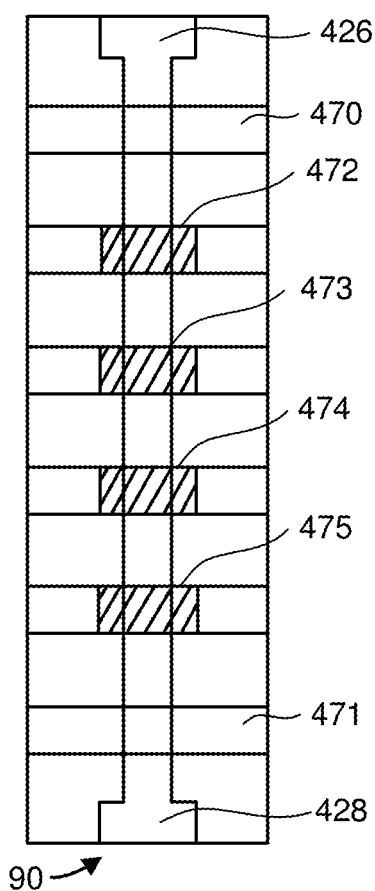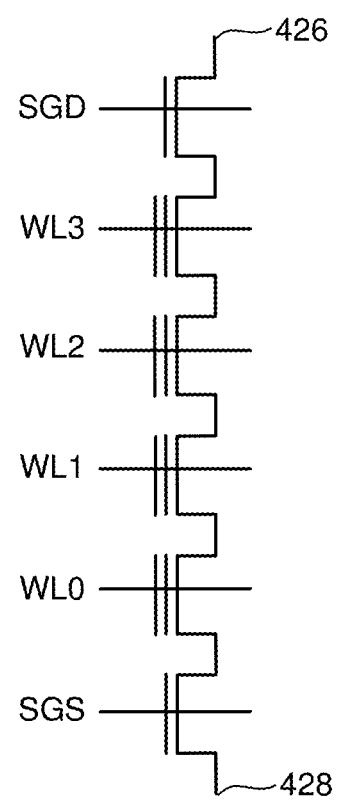
FIG. 4A  FIG. 4B

3D NAND WITH PARTIAL BLOCK ERASE

BACKGROUND

Semiconductor memory is widely used in various electronic devices such as mobile computing devices, mobile phones, solid-state drives, digital cameras, personal digital assistants, medical electronics, servers, and non-mobile computing devices. Semiconductor memory may comprise non-volatile memory or volatile memory. A non-volatile memory device allows information to be stored or retained even when the non-volatile memory device is not connected to a source of power (e.g., a battery). Examples of non-volatile memory include flash memory (e.g., NAND-type and NOR-type flash memory), Electrically Erasable Programmable Read-Only Memory (EEPROM), ferroelectric memory (e.g., FeRAM), magnetoresistive memory (e.g., MRAM), and phase change memory (e.g., PRAM). In recent years, non-volatile memory devices have been scaled in order to reduce the cost per bit. However, as process geometries shrink, many design and process challenges are presented. These challenges include increased variability in memory cell characteristics over process, voltage, and temperature variations.

BRIEF DESCRIPTION OF THE DRAWINGS

FIG. 2 depicts one embodiment of a portion of a monolithic three-dimensional memory array that includes a first memory level positioned below a second memory level.

FIG. 3B depicts a cross-sectional view of a memory structure using the vertically oriented select devices shown in FIG. 3A.

FIG. 4A depicts one embodiment of a NAND string.

FIG. 4B depicts one embodiment of the NAND string of FIG. 4A using a corresponding circuit diagram.

DETAILED DESCRIPTION

Figure 1A:
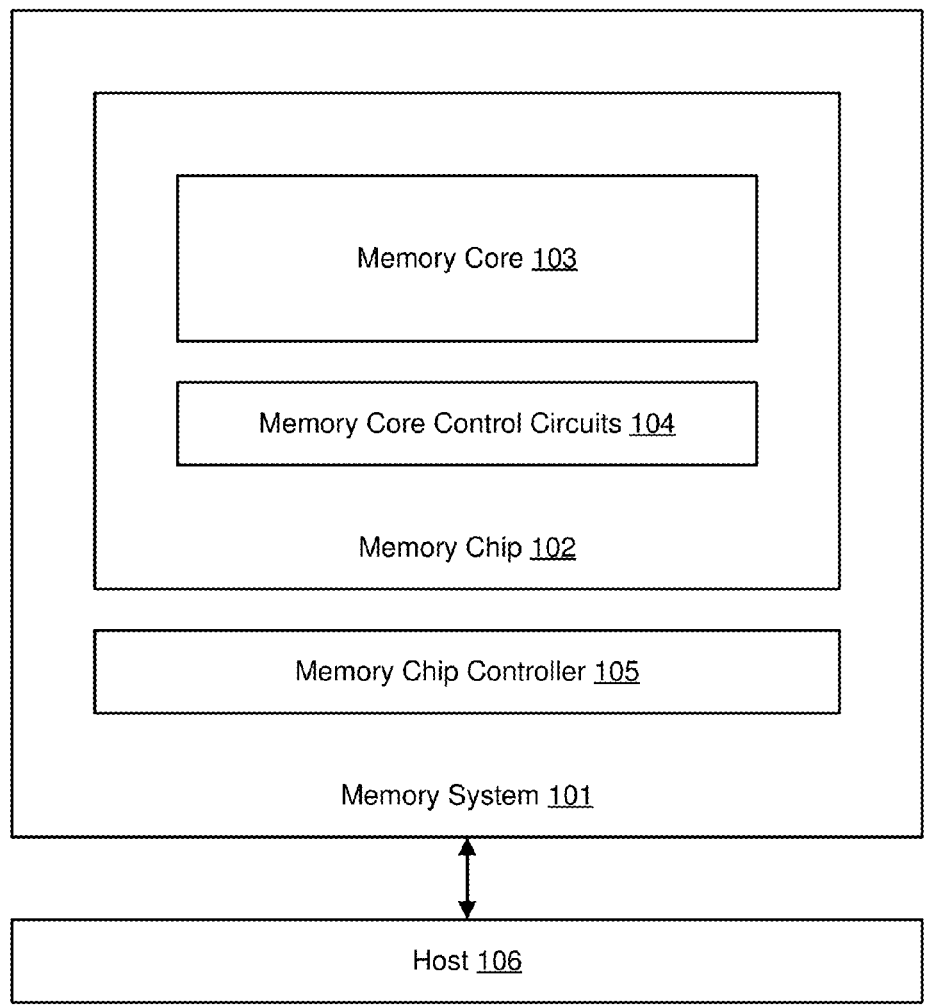
FIGS. 1A-1E depict various embodiments of a memory system.

Technology is described for performing a partial block erase operation or other memory operation on a portion of a memory block (e.g., a sub-block erase) or portion of a memory array. The memory array may include various memory structures including a vertical NAND structure, a Bit Cost Scalable (BiCS) NAND structure, or a 3D NAND structure. In some cases, a memory array may include a plurality of vertical NAND strings in which a first set of the plurality of vertical NAND strings are connected to a first drain-side select line for selectively connecting the first set of vertical NAND strings to a first set of bit lines, a second set of the plurality of vertical NAND strings are connected to a second drain-side select line for selectively connecting the second set of vertical NAND strings to a second set of bit lines, and both the first set and the second set of vertical NAND strings are connected to one or more shared word lines. Each vertical NAND string in the first set may be connected to a first word line finger and each vertical NAND string in the second set may be connected to a second word line finger that is physically shorted to the first word line finger. The first set of vertical NAND strings may also be connected to a first source-side select line for selectively connecting the first set of vertical NAND strings to a source line and the second set of vertical NAND strings may be connected to a second source-side select line for selectively connecting the second set of vertical NAND strings to the source line. In cases where a first vertical NAND string of the first set and a second vertical NAND string of the second set are both connected to selected bit lines and the same selected word line, selectivity of memory cells within the first vertical NAND string may be provided by applying different voltages to the first drain-side select line and the second drain-side select line. In one example, if the first vertical NAND string is a selected string, then a first drain-side select transistor of the first vertical NAND string may be set into a conducting state, while a second drain-side select transistor of the second vertical NAND string is set into a non-conducting state.

In one embodiment, a memory array may comprise a first set of vertical NAND strings connected to a first word line finger and a second set of vertical NAND strings connected to a second word line finger. The first word line finger may be physically shorted to the second word line finger. The physical short may comprise a low resistance conductor (e.g., a metal wire comprising tungsten or aluminum) arranged between the first word line finger and the second word line finger such that the resistance between the first word line finger and the second word line finger comprises a low electrical resistance path (e.g., less than 10 ohms). The physical short may be formed during fabrication of a memory die and may prevent the first word line finger and the second word line finger from ever being electrically isolated from each other during operation of the memory die. As both the first word line finger and the second word line finger may be physically shorted together, the ability to individually select either the first set of vertical NAND strings or the second set of vertical NAND strings may be facilitated or enabled via individual control of drain-side select gates connected to the first set of vertical NAND strings and the second set of vertical NAND strings. In some embodiments, only a single vertical NAND string within the first set of vertical NAND strings may be partially erased while the other vertical NAND strings within the first set of vertical NAND strings are not erased. In other embodiments, a subset of the first set of vertical NAND strings (e.g., eight NAND strings or a number of NAND strings associated with a partial page of data) may be partially erased during a partial block erase operation.

A memory block may include memory cells spread across multiple word line fingers. In some cases, a partial block erase operation may be performed on memory cells connected to one or more of the word line fingers less than all of the multiple word line fingers (e.g., the erase operation may be performed on memory cells connected to two word line fingers out of four word line fingers for the memory block). A partial block erase operation may be performed per word line finger or per string chunk (e.g., a subset of NAND strings connected to a common word line finger). In some cases, a partial block erase operation may be performed on only odd strings within a memory block or only even strings in a memory block.

In some embodiments, a partial block erase operation may be performed on a portion of a memory block to erase memory cells connected to one or more select gate fingers less than all of the select gate fingers for the entire memory block. The select gate fingers may correspond with either drain-side select gate fingers or source-side select gate fingers. In one example, a partial block erase operation may be performed to erase memory cells connected to two drain-side select gate fingers out of four drain-side select gate fingers. In another example, a partial block erase operation may be performed to erase memory cells connected to three source-side select gate fingers out of six source-side select gate fingers.

In some embodiments, the channel of a vertical NAND string may comprise a channel material with a low generation-recombination rate in order to reduce erase disturb caused by carrier generation. In one example, crystalline silicon (c-Si) may be used as the channel material. The carrier generation rate for a crystalline silicon channel may be substantially lower than that of a polysilicon channel due to a reduction in the number of defects and/or traps. In some embodiments, the crystalline silicon may be formed via metal induced crystallization or metal induced vertical channel crystallization.

3D NAND page sizes have increased over time as NAND storage capacities have increased and as vertical NAND string lengths have increased. While a larger page size (e.g., a 2 kB or 8 kB page size) may allow for improved array efficiency and a greater amount of data to be read or written at a time, having to erase an entire memory block to write a small amount of new data is not efficient in terms of power and memory performance. The benefits of performing partial block erase operations on a portion of a memory block include improved power and memory performance.

In one embodiment, a non-volatile storage system or a memory die may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may comprise various memory structures including planar NAND structures, vertical NAND structures, Bit Cost Scalable (BiCS) NAND structures, 3D NAND structures, or 3D ReRAM structures.

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading and/or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

FIG. 1A depicts one embodiment of a memory system 101 and a host 106. The memory system 101 may comprise a non-volatile storage system interfacing with the host (e.g., a mobile computing device or a server). In some cases, the memory system 101 may be embedded within the host 106. As examples, the memory system 101 may comprise a memory card, a solid-state drive (SSD) such a high density MLC SSD (e.g., 2-bits/cell or 3-bits/cell) or a high performance SLC SSD, or a hybrid HDD/SSD drive. As depicted, the memory system 101 includes a memory chip controller 105 and a memory chip 102. The memory chip 102 may include volatile memory and/or non-volatile memory. Although a single memory chip is depicted, the memory system 101 may include more than one memory chip (e.g., four or eight memory chips). The memory chip controller 105 may receive data and commands from host 106 and provide memory chip data to host 106. The memory chip controller 105 may include one or more state machines, page registers, SRAM, and control circuitry for controlling the operation of memory chip 102. The one or more state machines, page registers, SRAM, and control circuitry for controlling the operation of the memory chip may be referred to as managing or control circuits. The managing or control circuits may facilitate one or more memory array operations including forming, erasing, programming, or reading operations.

In some embodiments, the managing or control circuits (or a portion of the managing or control circuits) for facilitating one or more memory array operations may be integrated within the memory chip 102. The memory chip controller 105 and memory chip 102 may be arranged on a single integrated circuit or arranged on a single die. In other embodiments, the memory chip controller 105 and memory chip 102 may be arranged on different integrated circuits. In some cases, the memory chip controller 105 and memory chip 102 may be integrated on a system board, logic board, or a PCB.

The memory chip 102 includes memory core control circuits 104 and a memory core 103. Memory core control circuits 104 may include logic for controlling the selection of memory blocks (or arrays) within memory core 103, controlling the generation of voltage references for biasing a particular memory array into a read or write state, and generating row and column addresses. The memory core 103 may include one or more two-dimensional arrays of memory cells or one or more three-dimensional arrays of memory cells. In one embodiment, the memory core control circuits 104 and memory core 103 may be arranged on a single integrated circuit. In other embodiments, the memory core control circuits 104 (or a portion of the memory core control circuits) and memory core 103 may be arranged on different integrated circuits.

Referring to FIG. 1A, a memory operation may be initiated when host 106 sends instructions to memory chip controller 105 indicating that it would like to read data from memory system 101 or write data to memory system 101. In the event of a write (or programming) operation, host 106 may send to memory chip controller 105 both a write command and the data to be written. The data to be written may be buffered by memory chip controller 105 and error correcting code (ECC) data may be generated corresponding with the data to be written. The ECC data, which allows data errors that occur during transmission or storage to be detected and/or corrected, may be written to memory core 103 or stored in non-volatile memory within memory chip controller 105. In one embodiment, the ECC data is generated and data errors are corrected by circuitry within memory chip controller 105.

Referring to FIG. 1A, the operation of memory chip 102 may be controlled by memory chip controller 105. In one example, before issuing a write operation to memory chip 102, memory chip controller 105 may check a status register to make sure that memory chip 102 is able to accept the data to be written. In another example, before issuing a read operation to memory chip 102, memory chip controller 105 may pre-read overhead information associated with the data to be read. The overhead information may include ECC data associated with the data to be read or a redirection pointer to a new memory location within memory chip 102 in which to read the data requested. Once a read or write operation is initiated by memory chip controller 105, memory core control circuits 104 may generate the appropriate bias voltages for word lines and bit lines within memory core 103, as well as generate the appropriate memory block, row, and column addresses.

In some embodiments, one or more managing or control circuits may be used for controlling the operation of a memory array within the memory core 103. The one or more managing or control circuits may provide control signals to a memory array in order to perform a read operation and/or a write operation on the memory array. In one example, the one or more managing or control circuits may include any one of or a combination of control circuitry, state machines, decoders, sense amplifiers, read/write circuits, and/or controllers. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Figure 1B:
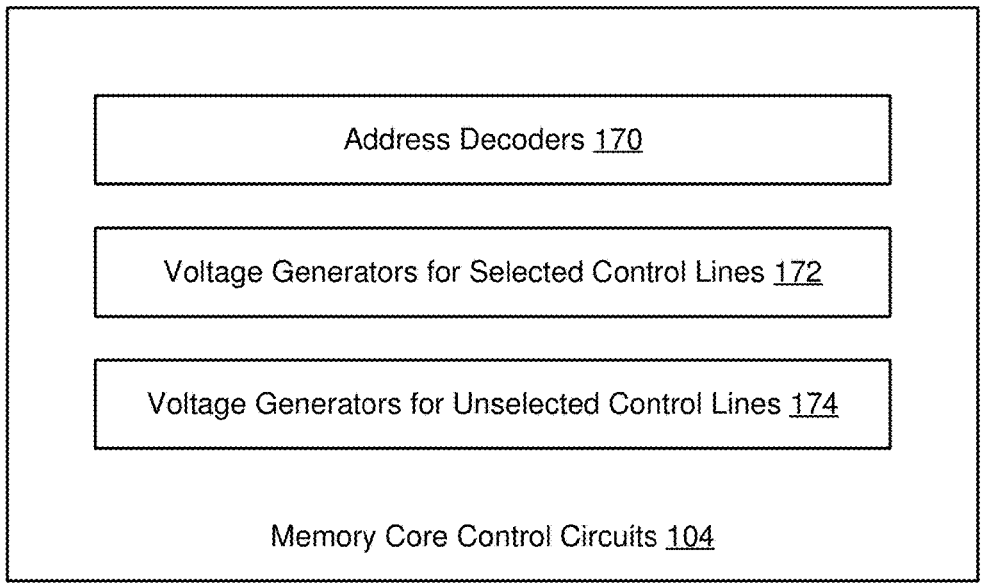

FIG. 1B depicts one embodiment of memory core control circuits 104. As depicted, the memory core control circuits 104 include address decoders 170, voltage generators for selected control lines 172, and voltage generators for unselected control lines 174. Control lines may include word lines, bit lines, or a combination of word lines and bit lines. Selected control lines may include selected word lines or selected bit lines that are used to place memory cells into a selected state. Unselected control lines may include unselected word lines or unselected bit lines that are used to place memory cells into an unselected state. The voltage generators (or voltage regulators) for selected control lines 172 may comprise one or more voltage generators for generating selected control line voltages. The voltage generators for unselected control lines 174 may comprise one or more voltage generators for generating unselected control line voltages. Address decoders 170 may generate memory block addresses, as well as row addresses and column addresses for a particular memory block.

Figure 1C:
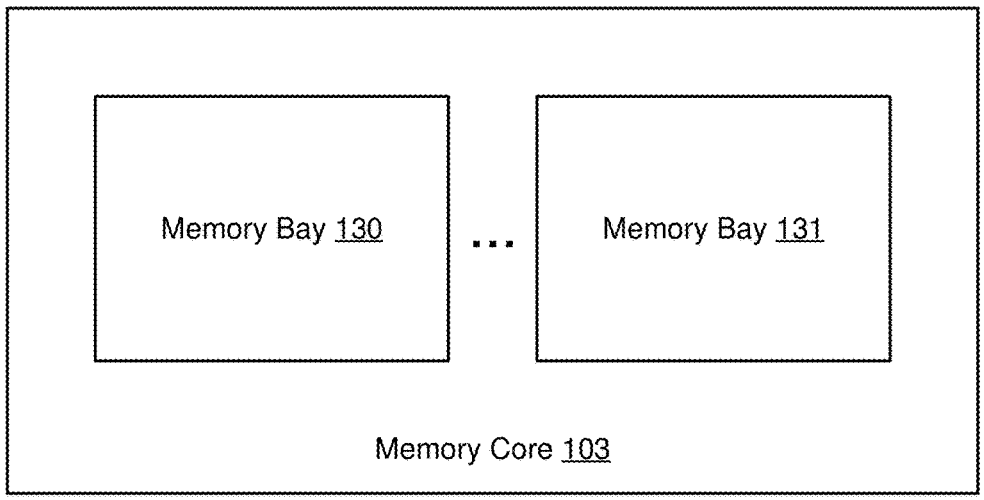
Figure 1D:
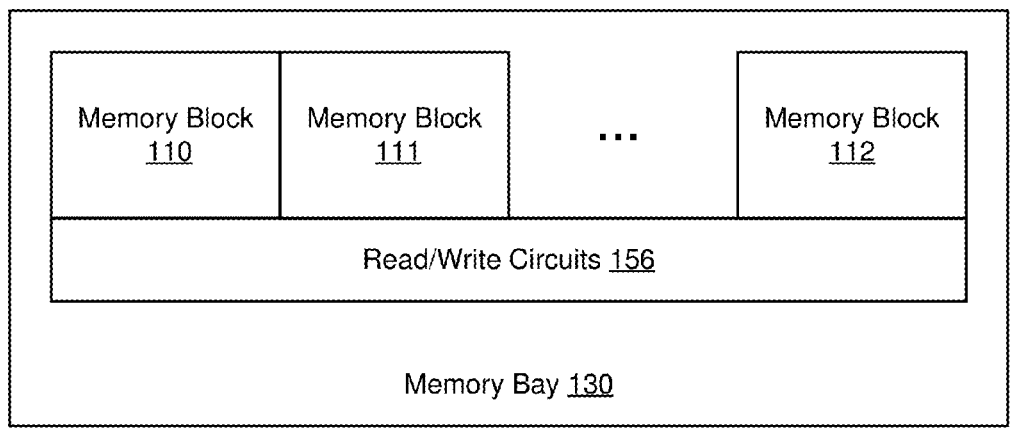
Figure 1E:
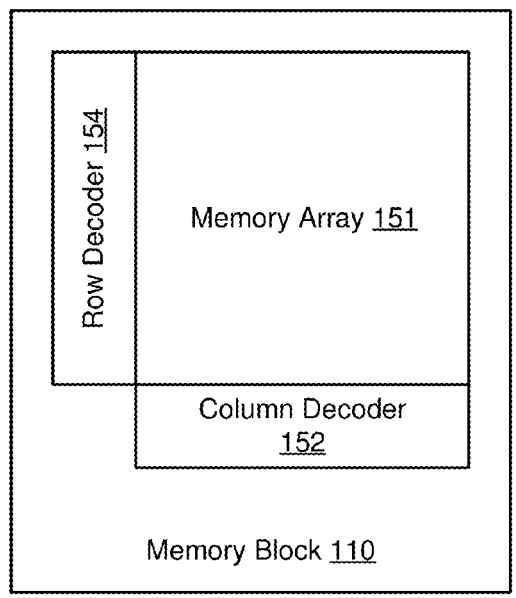

FIGS. 1C-1E depict one embodiment of a memory core organization that includes a memory core having multiple memory bays, and each memory bay having multiple memory blocks. Although a memory core organization is disclosed where memory bays comprise memory blocks, and memory blocks comprise a group of memory cells, other organizations or groupings can also be used with the technology described herein.

FIG. 1C depicts one embodiment of memory core 103 in FIG. 1A. As depicted, memory core 103 includes memory bay 130 and memory bay 131. In some embodiments, the number of memory bays per memory core can be different for different implementations. For example, a memory core may include only a single memory bay or a plurality of memory bays (e.g., 16 memory bays or 256 memory bays).

FIG. 1D depicts one embodiment of memory bay 130 in FIG. 1C. As depicted, memory bay 130 includes memory blocks 110-112 and read/write circuits 156. In some embodiments, the number of memory blocks per memory bay may be different for different implementations. For example, a memory bay may include one or more memory blocks (e.g., 32 memory blocks per memory bay). Read/write circuits 156 include circuitry for reading and writing memory cells within memory blocks 110-112. As depicted, the read/write circuits 156 may be shared across multiple memory blocks within a memory bay. This allows chip area to be reduced since a single group of read/write circuits 156 may be used to support multiple memory blocks. However, in some embodiments, only a single memory block may be electrically coupled to read/write circuits 156 at a particular time to avoid signal conflicts.

In some embodiments, read/write circuits 156 may be used to write one or more pages of data into the memory blocks 110-112 (or into a subset of the memory blocks). The memory cells within the memory blocks 110-112 may permit direct over-writing of pages (i.e., data representing a page or a portion of a page may be written into the memory blocks 110-112 without requiring an erase or reset operation to be performed on the memory cells prior to writing the data). In one example, the memory system 101 in FIG. 1A may receive a write command including a target address and a set of data to be written to the target address. The memory system 101 may perform a read-before-write (RBW) operation to read the data currently stored at the target address before performing a write operation to write the set of data to the target address. The memory system 101 may then determine whether a particular memory cell may stay at its current state (i.e., the memory cell is already at the correct state), needs to be set to a "0" state, or needs to be reset to a "1" state. The memory system 101 may then write a first subset of the memory cells to the "0" state and then write a second subset of the memory cells to the "1" state. The memory cells that are already at the correct state may be skipped over, thereby improving programming speed and reducing the cumulative voltage stress applied to unselected memory cells. A particular memory cell may be set to the "1" state by applying a first voltage difference across the particular memory cell of a first polarity (e.g., +1.5V). The particular memory cell may be reset to the "0" state by applying a second voltage difference across the particular memory cell of a second polarity that is opposite to that of the first polarity (e.g., −1.5V).

In some cases, read/write circuits 156 may be used to program a particular memory cell to be in one of three or more data/resistance states (i.e., the particular memory cell may comprise a multi-level memory cell). In one example, the read/write circuits 156 may apply a first voltage difference (e.g., 2V) across the particular memory cell to program the particular memory cell into a first state of the three or more data/resistance states or a second voltage difference (e.g., 1V) across the particular memory cell that is less than the first voltage difference to program the particular memory cell into a second state of the three or more data/resistance states. Applying a smaller voltage difference across the particular memory cell may cause the particular memory cell to be partially programmed or programmed at a slower rate than when applying a larger voltage difference. In another example, the read/write circuits 156 may apply a first voltage difference across the particular memory cell for a first time period (e.g., 150 ns) to program the particular memory cell into a first state of the three or more data/resistance states or apply the first voltage difference across the particular memory cell for a second time period less than the first time period (e.g., 50 ns). One or more programming pulses followed by a memory cell verification phase may be used to program the particular memory cell to be in the correct state.

FIG. 1E depicts one embodiment of memory block 110 in FIG. 1D. As depicted, memory block 110 includes a memory array 151, row decoder 154, and column decoder 152. Memory array 151 may comprise a contiguous group of memory cells having contiguous word lines and bit lines. Memory array 151 may comprise one or more layers of memory cells. Memory array 151 may comprise a two-dimensional memory array or a three-dimensional memory array. The row decoder 154 decodes a row address and selects a particular word line in memory array 151 when appropriate (e.g., when reading or writing memory cells in memory array 151). The column decoder 152 decodes a column address and selects a particular group of bit lines in memory array 151 to be electrically coupled to read/write circuits, such as read/write circuits 156 in FIG. 1D. In one embodiment, the number of word lines is 4K per memory layer, the number of bit lines is 1K per memory layer, and the number of memory layers is 4, providing a memory array 151 containing 16M memory cells.

In one embodiment, memory array 151 may comprise memory cells that are oriented in a horizontal plane that is horizontal to the supporting substrate. In another embodiment, memory array 151 may comprise memory cells that are oriented in a vertical plane that is vertical with respect to the supporting substrate (i.e., the vertical plane is perpendicular to the supporting substrate). In this case, the bit lines of memory array 151 may comprise vertical bit lines.

Figure 2:
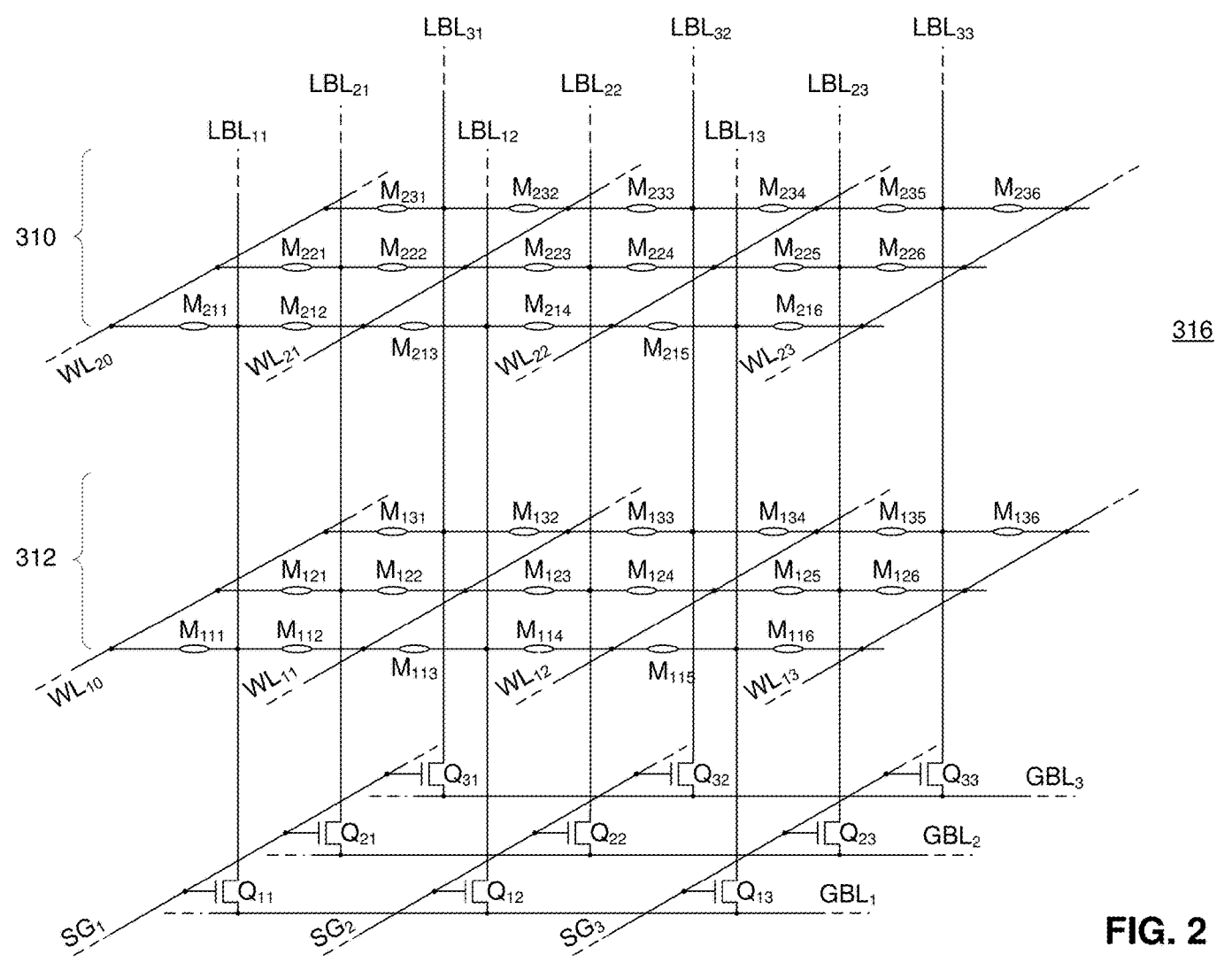

FIG. 2 depicts one embodiment of a portion of a monolithic three-dimensional memory array 316 that includes a first memory level 312 positioned below a second memory level 310. Memory array 316 is one example of an implementation for memory array 151 in FIG. 1E. As depicted, the local bit lines $LBL_{11}$-$LBL_{33}$ are arranged in a first direction (i.e., a vertical direction) and the word lines $WL_{10}$-$WL_{23}$ are arranged in a second direction perpendicular to the first direction. This arrangement of vertical bit lines in a monolithic three-dimensional memory array is one embodiment of a vertical bit line memory array. As depicted, disposed between the intersection of each local bit line and each word line is a particular memory cell (e.g., memory cell $M_{111}$ is disposed between local bit line $LBL_{11}$ and word line $WL_{10}$). In one example, the particular memory cell may include a floating gate device or a charge trap device (e.g., using a silicon nitride material). In another example, the particular memory cell may include a reversible resistance-switching material, a metal oxide, a phase change material, or a ReRAM material. The global bit lines $GBL_1$-$GBL_3$ are arranged in a third direction that is perpendicular to both the first direction and the second direction. A set of bit line select devices (e.g., $Q_{11}$-$Q_{31}$) may be used to select a set of local bit lines (e.g., $LBL_{11}$-$LBL_{31}$). As depicted, bit line select devices $Q_{11}$-$Q_{31}$ are used to select the local bit lines $LBL_{11}$-$LBL_{31}$ and to connect the local bit lines $LBL_{11}$-$LBL_{31}$ to the global bit lines $GBL_1$-$GBL_3$ using row select line $SG_1$. Similarly, bit line select devices $Q_{12}$-$Q_{32}$ are used to selectively connect the local bit lines $LBL_{12}$-$LBL_{32}$ to the global bit lines $GBL_1$-$GBL_3$ using row select line $SG_2$ and bit line select devices $Q_{13}$-$Q_{33}$ are used to selectively connect the local bit lines $LBL_{13}$-$LBL_{33}$ to the global bit lines $GBL_1$-$GBL_3$ using row select line $SG_3$.

Referring to FIG. 2, as only a single bit line select device is used per local bit line, only the voltage of a particular global bit line may be applied to a corresponding local bit line. Therefore, when a first set of local bit lines (e.g., $LBL_{11}$-$LBL_{31}$) is biased to the global bit lines $GBL_1$-$GBL_3$, the other local bit lines (e.g., $LBL_{12}$-$LBL_{32}$ and $LBL_{13}$-$LBL_{33}$) must either also be driven to the same global bit lines $GBL_1$-$GBL_3$ or be floated. In one embodiment, during a memory operation, all local bit lines within the memory array are first biased to an unselected bit line voltage by connecting each of the global bit lines to one or more local bit lines. After the local bit lines are biased to the unselected bit line voltage, then only a first set of local bit lines $LBL_{11}$-$LBL_{31}$ are biased to one or more selected bit line voltages via the global bit lines $GBL_1$-$GBL_3$, while the other local bit lines (e.g., $LBL_{12}$-$LBL_{32}$ and $LBL_{13}$-$LBL_{33}$) are floated. The one or more selected bit line voltages may correspond with, for example, one or more read voltages during a read operation or one or more programming voltages during a programming operation.

In one embodiment, a vertical bit line memory array, such as memory array 316, includes a greater number of memory cells along the word lines as compared with the number of memory cells along the vertical bit lines (e.g., the number of memory cells along a word line may be more than 10 times the number of memory cells along a bit line). In one example, the number of memory cells along each bit line may be 16 or 32, while the number of memory cells along each word line may be 2048 or more than 4096.

Figure 3A:
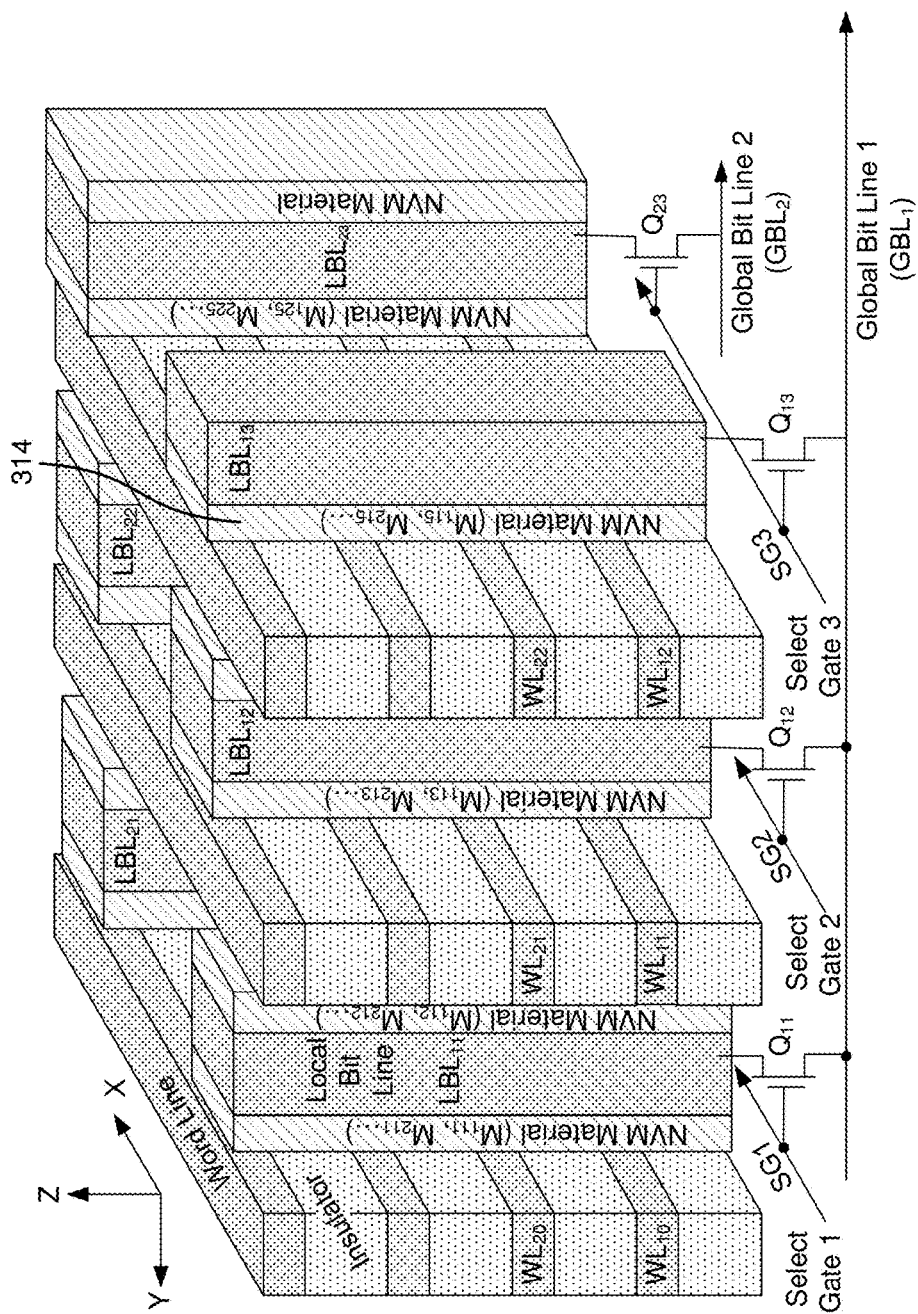
FIG. 3A depicts one embodiment of a portion of a monolithic three-dimensional memory array that includes vertical strips of a non-volatile memory material.

FIG. 3A depicts one embodiment of a portion of a monolithic three-dimensional memory array that includes vertical strips of a non-volatile memory material. The physical structure depicted in FIG. 3A may comprise one implementation for a portion of the monolithic three-dimensional memory array depicted in FIG. 2. The vertical strips of non-volatile memory material may be formed in a direction that is perpendicular to a substrate (e.g., in the Z direction). A vertical strip of the non-volatile memory material 314 may include, for example, a vertical oxide layer, a vertical metal oxide layer (e.g., nickel oxide or hafnium oxide), a vertical layer of phase change material, or a vertical charge trapping layer (e.g., a layer of silicon nitride). The vertical strip of material may comprise a single continuous layer of material that may be used by a plurality of memory cells or devices. In one example, portions of the vertical strip of the non-volatile memory material 314 may comprise a part of a first memory cell associated with the cross section between $WL_{12}$ and $LBL_{13}$ and a part of a second memory cell associated with the cross section between $WL_{22}$ and $LBL_{13}$. In some cases, a vertical bit line, such as $LBL_{13}$, may comprise a vertical structure (e.g., a rectangular prism, a cylinder, or a pillar) and the non-volatile material may completely or partially surround the vertical structure (e.g., a conformal layer of phase change material surrounding the sides of the vertical structure). As depicted, each of the vertical bit lines may be connected to one of a set of global bit lines via a select transistor. The select transistor may comprise a MOS device (e.g., an NMOS device) or a vertical thin-film transistor (TFT). In some cases, the select transistor may comprise a bipolar transistor, a JFET, or other type of semiconductor transistor.

FIG. 3B depicts a cross-sectional view of a memory structure using the vertically oriented select devices shown in FIG. 3A. The memory structure of FIG. 3B may comprise a continuous mesh array of memory elements because there are memory elements connected to both sides of the bit lines and memory elements connected to both sides of the word lines. At the bottom of FIG. 3B, a silicon substrate is depicted. Implemented above the surface of the silicon substrate are various metal lines including ML-0, ML-1, and ML-2. Line 526 of ML-2 serves as a respective global bit line (GBL). The Pillar Select Layer includes two oxide layers 520 with a gate material layer 522 sandwiched therebetween. The oxide layers 520 can be $SiO_2$. The metal line ML-2 526 serving as a global bit line can be implemented of any suitable material, including Tungsten, or Tungsten on a Titanium Nitride adhesion layer or a sandwich of n+ polysilicon on Tungsten on Titanium Nitride adhesion layer. Gate material 522 can be polysilicon, Titanium Nitride, Tantalum Nitride, Nickel Silicide or any other suitable material. Gate material 522 implements the row select lines $SG_x$ (e.g. $SG_1$, $SG_2$, ... of FIG. 3A), which are labeled in FIG. 3B as row select lines 580, 582, 584, 586, 588 and 590.

The memory layer includes a set of vertical bit lines 530 (comprising N+ polysilicon). Interspersed between the vertical bit lines 530 are alternating oxide layers 534 and word line layers 536. In one embodiment, the word lines are made from TiN. Between the vertical bit lines 530 and the stacks of alternating oxide layers 534 and word line layers 536 are vertically oriented layers of reversible resistance switching material 532. In one embodiment the reversible resistance switching material is made of Hafnium Oxide $HfO_2$. In another embodiment, the reversible resistance switching material 532 may include a layer of amorphous silicon (e.g., a Si barrier layer) and a layer titanium oxide (e.g., a TiO2 switching layer). Box 540 depicts one example memory element which includes the reversible resistance switching material 532 sandwiched between a word line 536 and vertical bit line 530. Directly below each vertical bit line 530 are the vertically oriented select devices 504, each of which comprises (in one example embodiment) a n+/p−/n+ TFT. Each of the vertically oriented select devices 504 have oxide layers 505 on each side. FIG. 3B also shows an n+ polysilicon layer 524. As depicted, the npn TFT of vertically oriented select devices 504 can be used to connect the global bit line GBL (layer 526) with any of the vertical bit lines 530.

Moreover, FIG. 3B shows six row select lines ($SG_x$) 580, 582, 584, 586, 588 and 590 in the gate material layer 522, each underneath a stack of multiple word lines. Each of the row select lines 580, 582, 584, 586, 588 and 590 is positioned between two vertically oriented select devices 504, above and not in the substrate. Each row select line may serve as the gate signal to either of the two neighboring vertically oriented select devices 504; therefore, the vertically oriented select devices 504 are said to be double gated. Each vertically oriented select device 504 can be controlled by two different row select lines, in this embodiment. One aspect of the vertically oriented select devices incorporated to the base portion of each bit line pillar is that two adjacent vertically oriented select devices share the same gate region, which may allow the vertically oriented select devices to be closer together.

In some embodiments, a portion of a memory array may be formed by first etching through an alternating stack of word line layers and dielectric layers (e.g., etching through layers of TiN or polysilicon that are separated by oxide layers) to form a plurality of memory holes. The plurality of memory holes may comprise rectangular, square, or cylindrical holes. The plurality of memory holes may be formed by patterning and then removing material using various etching techniques such as dry etching, wet chemical etching, plasma etching, or reactive-ion etching (ME). After the plurality of memory holes have been created, the layers for forming vertical pillars within the plurality of memory holes may be deposited. The layers of the vertical pillars may be deposited using various deposition techniques such as chemical vapor deposition (CVD), physical vapor deposition (PVD), or atomic layer deposition (ALD).

FIG. 4A depicts one embodiment of a NAND string 90. FIG. 4B depicts one embodiment of the NAND string of FIG. 4A using a corresponding circuit diagram. As depicted, NAND string 90 includes four transistors 472-475 in series between a first select gate 470 (i.e., a drain-side select gate) and a second select gate 471 (i.e., a source-side select gate). Select gate 470 connects the NAND string 90 to a bit line 426 and is controlled by applying the appropriate voltage to the select line SGD. In this case, the bit line 426 is directly connected to the drain side end of the NAND string. Select gate 471 connects the NAND string 90 to a source line 428 and is controlled by applying the appropriate voltage to the select line SGS. In this case, the source line 428 is directly connected to the source-side end of the NAND string 90. The gates of transistors 472-475 are connected to word lines WL3, WL2, WL1, and WL0, respectively.

Note that although FIGS. 4A-4B show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. In some cases, the NAND string may include charge trap transistors in place of the floating-gate transistors, in which charge may be stored in a charge trapping layer of the charge trap transistor (e.g., a layer of silicon nitride). Both charge trap transistors and floating-gate transistors may comprise memory cell transistors for storing data. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a p-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory may be described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 4C:
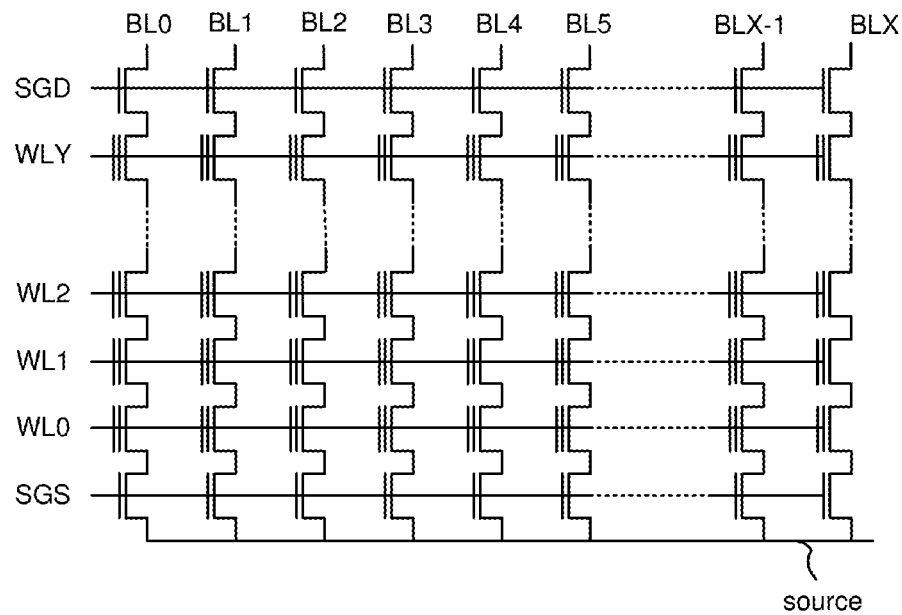
FIG. 4C depicts one embodiment of a memory block including a plurality of NAND strings.

FIG. 4C depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure. In one embodiment, the source-side select gate controlled by the source-side selection signal SGS and the drain-side select gate controlled by the drain-side selection signal SGD may comprise transistors without a charge trapping layer or transistors that include a charge trapping structure.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate (or a charge trapping layer) via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are several ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

In some cases, during a read operation or a sensing operation, the source-side selection signal SGS may be set to a particular voltage (e.g., 7V or 10V) to pass the voltage applied to the source line (source) to the source junction of the memory cell transistors (e.g., comprising floating gate transistors) whose gates are connected to WL0 or the word line closest to the source-side select gate.

Figure 4D:
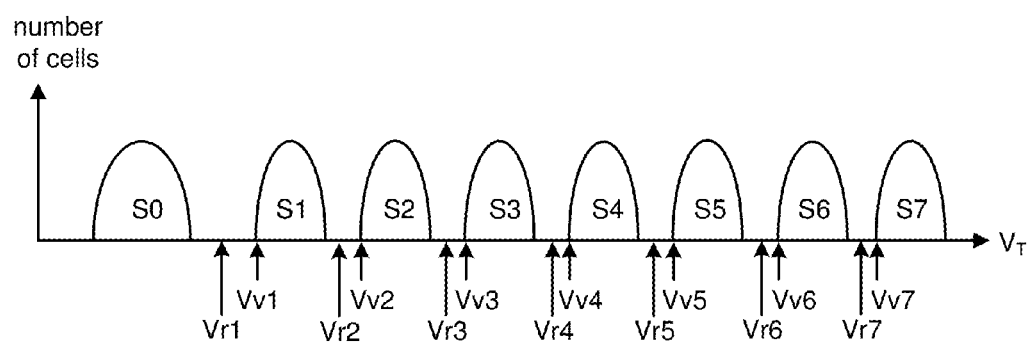
FIG. 4D depicts one embodiment of possible threshold voltage distributions for a three-bit-per-cell memory cell.

FIG. 4D depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 4E:
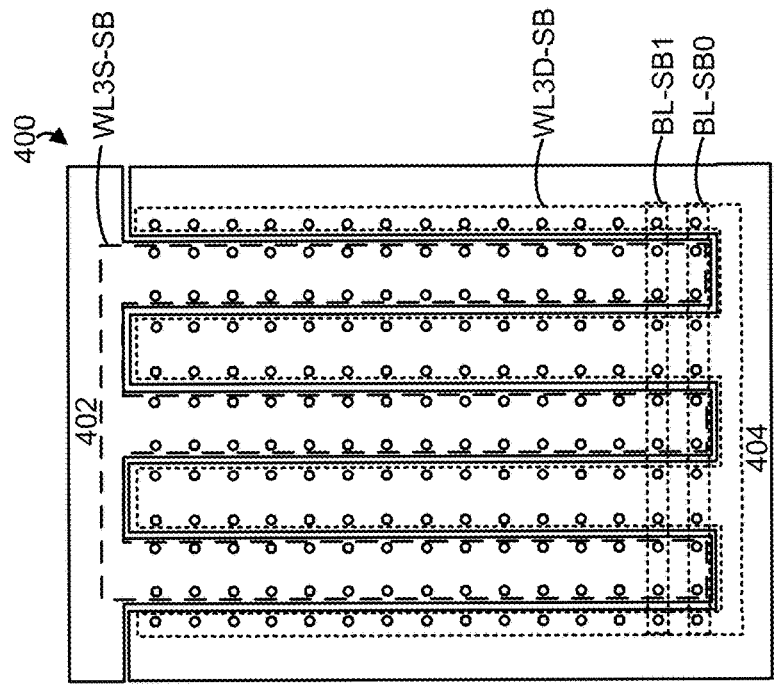
FIGS. 4E-4J depict various embodiments of NAND structures.

FIG. 4E depicts a top view of U-shaped NAND strings that are part of a memory block 400. The block 400 may include NAND string sub-blocks NS-SB0 to NS-SB5. Block 400 may comprise one example implementation of memory block 110 in FIG. 1D. The top view depicts a representative word line layer among multiple word line layers in a stack that includes alternating dielectric and conductive layers. The conductive layers may include doped polysilicon, metal, or metal silicide and the dielectric layers may include silicon dioxide. The word line layer is divided into two portions (or planes) 402 and 404. Each word line layer portion can be considered to be a word line, and is connected to control gates of associated memory cells.

Each block includes a slit pattern. A slit may refer to a void which extends vertically in the stack, typically from an etch stop layer at the bottom to at least a top layer of the stack. A slit 406 is a single continuous slit which extends in a zig-zag pattern in the block so that the block is divided into the two portions 402 and 404 that are insulated from one another. This approach can provide greater flexibility in controlling the memory cells since the two word line layer portions can be driven independently at each layer or height in the stack. Each block includes rows of vertical memory holes or pillars, represented by circles. The memory holes extend vertically in the stack and include memory cells such as in a vertical NAND string. An example column of memory cells along a line 420 includes C0D to C5D (D denotes a drain side column and S denotes a source side column).

Figure 4F:
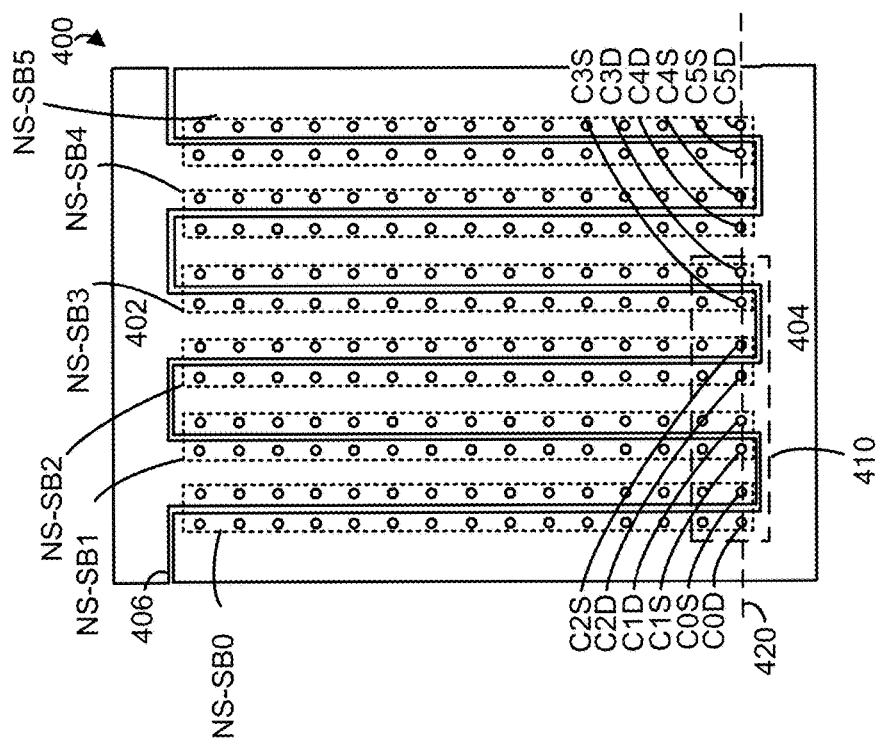

FIG. 4F depicts the block 400 in FIG. 4E showing example word line subsets WL3D-SB and WL3S-SB and example bit line subsets BL-SB0 and BL-SB1. WL3S-SB is a portion of a word line layer (e.g., the third word line layer) connected to one memory cell in the source-side of each U-shaped NAND string, and WL3D-SB is a portion of the word line layer connected to one memory cell in the drain-side of each U-shaped NAND string. When U-shaped NAND strings (or pipe-shaped NAND strings) are used, each NAND string sub-block can include two adjacent rows of columns of memory cells. In the sub-block, the adjacent rows are separated by the slit. The columns of memory cells on one side of the slit are drain-side columns (e.g., C0D, C1D, C2D and C3D in FIG. 4E) of NAND strings, and the columns of memory cells on the other side of the slit are source-side columns (e.g., C0S, C1S, C2S and C3S in FIG. 4E) of the NAND strings. Word line drivers can independently provide signals such as voltage waveforms to the word line layer portions 402 and 404.

Figure 4G:
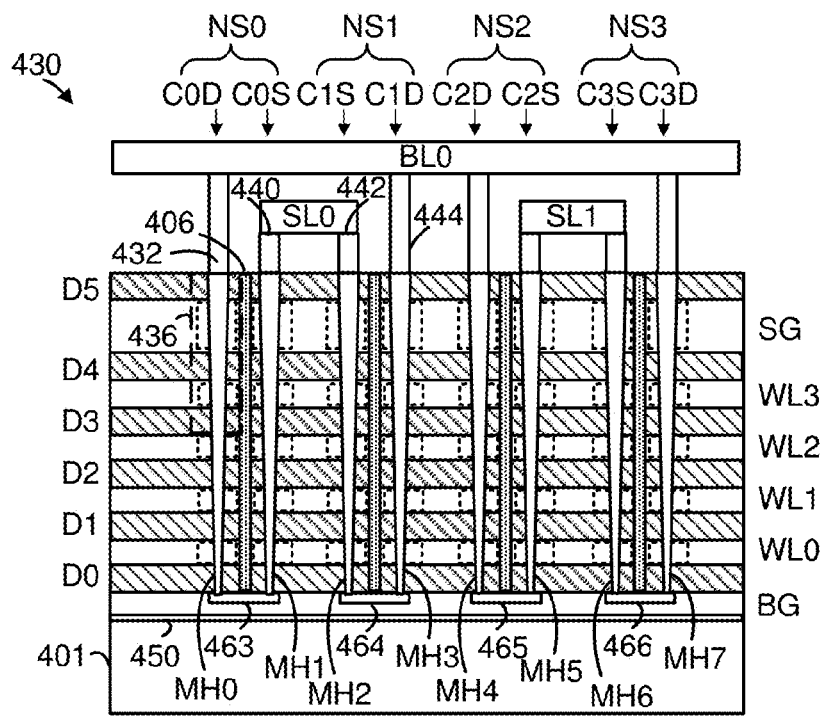

FIG. 4G depicts a cross-sectional view of the portion 410 of the block 400 of FIG. 4E along line 420. Columns of memory cells are depicted in the multi-layer stack. The portion 410 includes the substrate 401, an insulating film 450 on the substrate, and a back gate layer BG, which is a conductive layer on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 466 which connect the columns. The back gate connects the two columns of each U-shaped NAND string. The back gate may form the gate of a back gate transistor that controls conduction of the "pipe connection" comprising the connecting portions 463 to 466 which connect the columns. By applying an appropriate bias to the back gate, the back gate transistor may electrically connect the two columns of each U-shaped NAND string.

As depicted in FIG. 4G, NS0 (NS=NAND string) includes columns C0D and C0S and connecting portion 463 and has a drain end 432 and a source end 440. NS1 includes columns C1S and C1D and connecting portion 464 and has a drain end 444 and a source end 442. NS2 includes columns C2D and C2S and connecting portion 465. NS3 includes columns C3S and C3D and connecting portion 466. The source line SL0 is connected to the source ends 440 and 442 of two adjacent memory strings NS0 and NS1. Additional U-shaped NAND strings in the stack 430 may extend behind the U-shaped NAND strings depicted in the cross-section. The U-shaped NAND strings NS0-NS3 are each in a different NAND string sub-block, but are in a common BL subset. The bit line BL0 connects to the drain ends 432 and 444. Memory holes MH0-MH7 are depicted extending vertically in the stack and correspond with respective memory holes for the memory cells of the NAND strings.

Figure 4H:
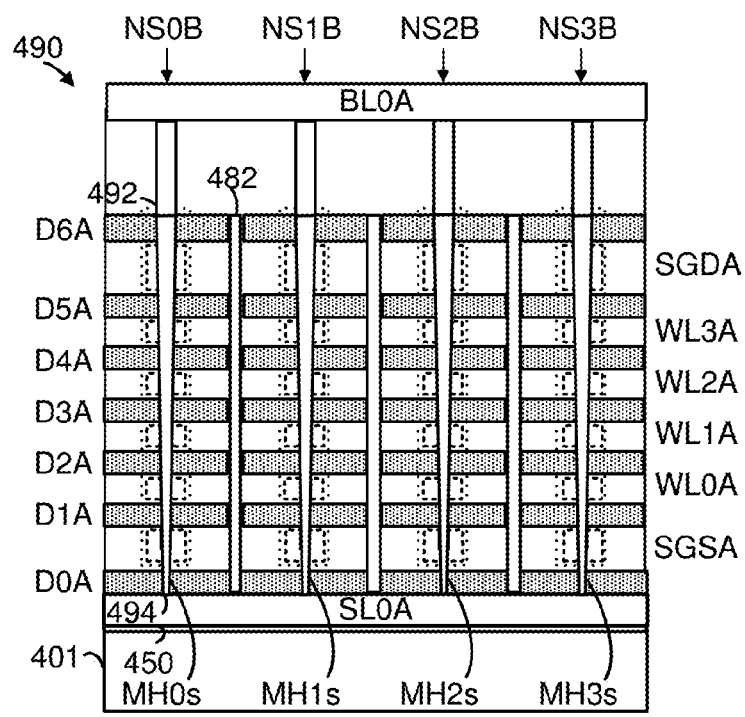
Figures 4I, 4J:
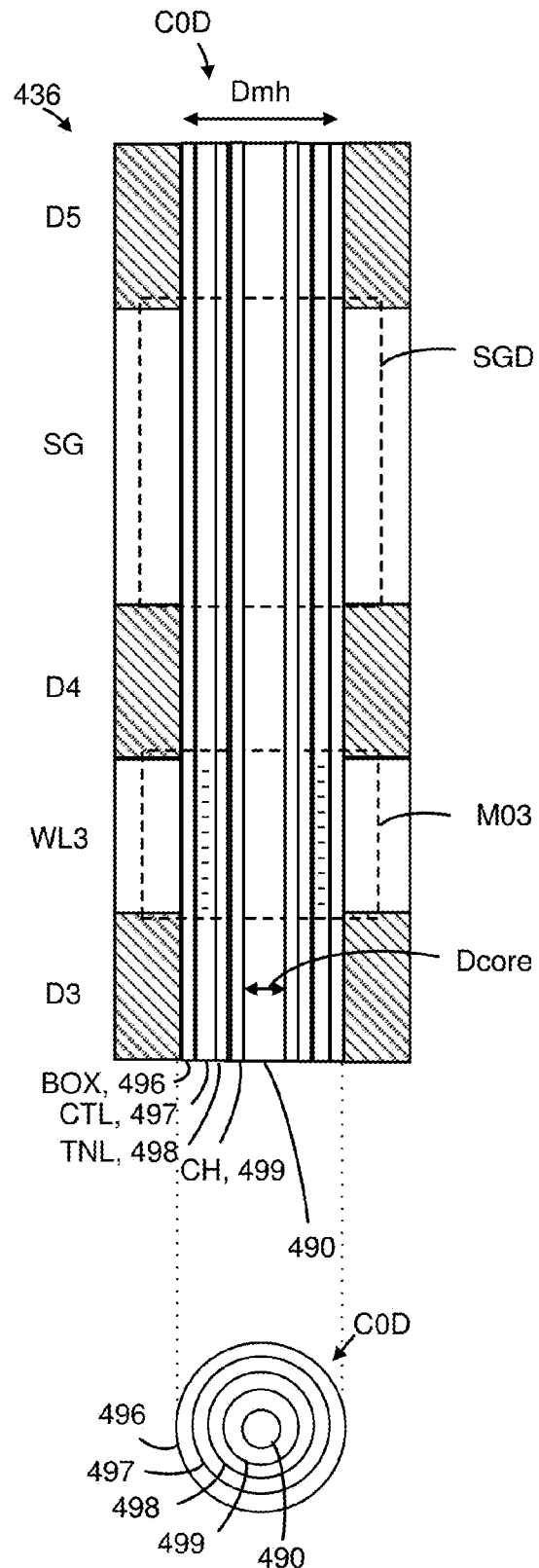

FIG. 4I depicts a close-up view of the region 436 of the column C0D of FIG. 4G, showing a drain-side select gate transistor SGD and a memory cell M03. The region also shows portions of the dielectric layers D3, D4 and D5. Each column includes a number of layers which are deposited along the sidewalls of the column. These layers can include oxide-nitride-oxide (O—N—O) and polysilicon layers which are deposited, e.g., using atomic layer deposition. For example, a block oxide (BOX) can be deposited as layer 496, a nitride such as SiN as a charge trapping layer (CTL) can be deposited as layer 497 and a tunnel oxide (TNL) can be deposited as layer 498, to provide the O—N—O layers. Further, a polysilicon body or channel (CH) can be deposited as layer 499, and a core filler dielectric can be deposited as region 490. Additional memory cells may be similarly formed throughout the columns. Dmh represents the memory hole diameter and Dcore represents the core diameter, which can both vary along the length or longitudinal axis of the memory hole. When a memory cell is programmed, electrons are stored in a portion of the charge trapping layer which is associated with the memory cell. For example, electrons are represented by "-" symbols in the CTL 497 for the memory cell M03.

FIG. 4J depicts a cross-sectional view of the column C0D of FIG. 4I. In some cases, each layer may be ring-shaped except for the core filler, which may be a tapered cylinder. In some cases, each layer may comprise a ring-shaped tapered hollow cylinder, except for the core filler, which may be a tapered solid cylinder.

FIG. 4H depicts a cross-sectional view of a single vertical NAND string architecture. As depicted, vertical strings of memory cells corresponding with NAND strings NS0B, NS1B, NS2B and NS3B are depicted in the multi-layer stack 490. The stack 490 includes a substrate 401, an insulating film 450 on the substrate, and a portion of a source line SL0A arranged above the insulating film 450. NAND string NS0B has a source end 494 and a drain end 492. A portion of a bit line BL0A is also depicted. Dashed lines depict memory cells and select gate transistors. Memory holes MH0S, MH1s, MH2s and MH3s are associated with NAND strings NS0B, NS1B, NS2B and NS3B. Word line layers are WL0A, WL1A, WL2A and WL3A. Dielectric layers are D0A, D1A, D2A, D3A, D4A, D5A and D6A. SGSA is a source-side select gate layer and SGDA is a drain-side select gate layer. As depicted, in contrast to U-shaped NAND strings in which the source lines and bit lines connect to the U-shaped NAND strings at the top of the NAND strings, with single vertical NAND strings the bit lines connect to the vertical NAND strings at the top of the NAND strings and the source lines connect to the vertical NAND strings at the bottom of the NAND strings.

Figure 5:
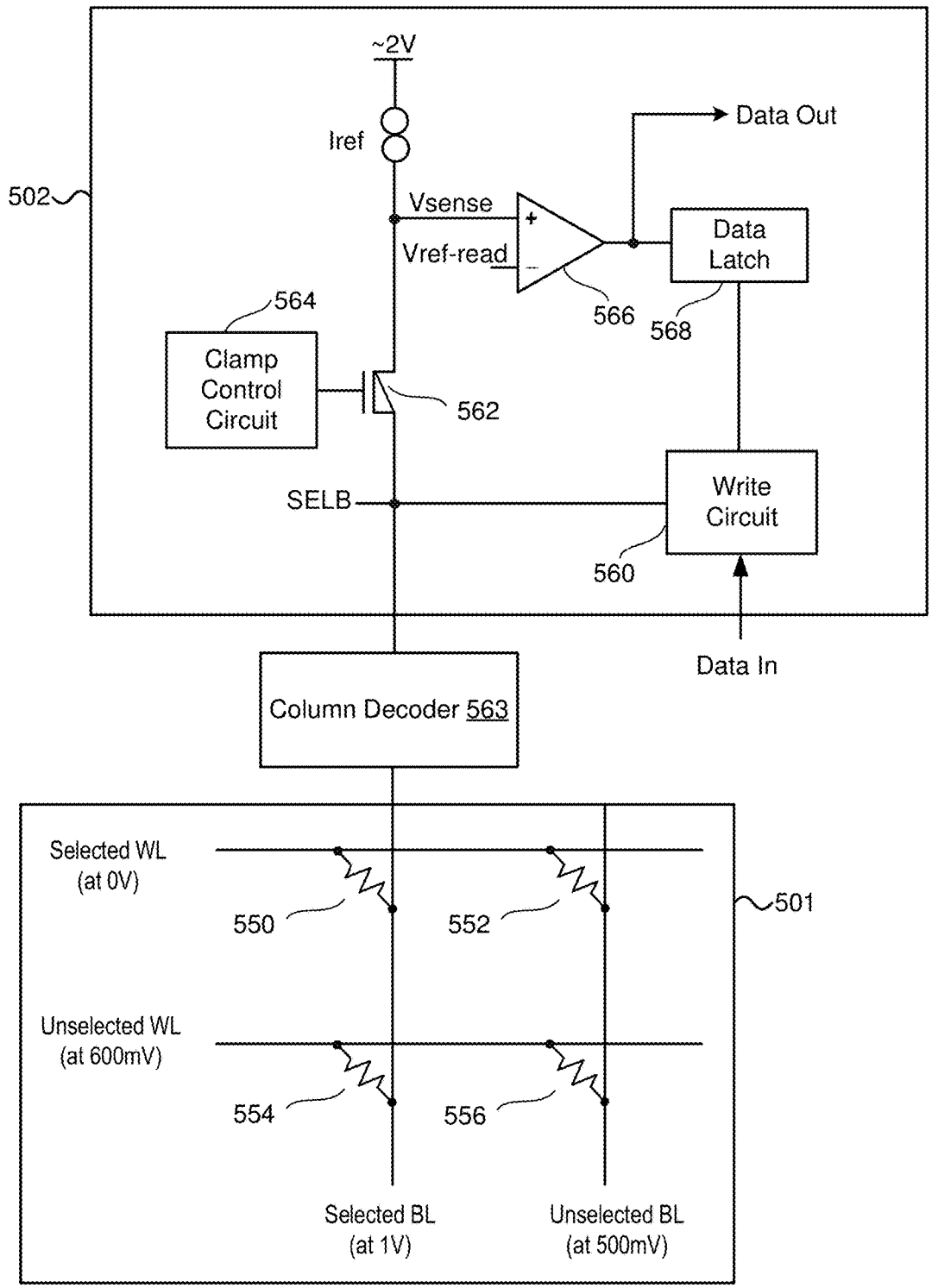
FIG. 5 depicts one embodiment of a read/write circuit.

FIG. 5 depicts one embodiment of a read/write circuit 502 along with a portion of a memory array 501. Read/write circuit 502 is one example of an implementation of read/write circuit 156 in FIG. 1D. The portion of a memory array 501 includes two of the many bit lines (one selected bit line labeled "Selected BL" and one unselected bit line labeled "Unselected BL") and two of the many word lines (one selected word line labeled "Selected WL" and one unselected word line labeled "Unselected WL"). The portion of a memory array also includes a selected memory cell 550 and unselected memory cells 552-556. In one embodiment, the portion of a memory array 501 may comprise a memory array with bit lines arranged in a direction horizontal to the substrate, such as memory array 201 in FIG. 2A. In another embodiment, the portion of a memory array 501 may comprise a memory array with bit lines arranged in a vertical direction that is perpendicular to the substrate, such as memory array 316 in FIG. 2.

As depicted, during a memory array operation (e.g., a programming operation), the selected bit line may be biased to 1V, the unselected word line may be biased to 0.6V, the selected word line may be biased to 0V, and the unselected bit line may be biased to 0.5V. In some embodiments, during a second memory array operation, the selected bit line may be biased to a selected bit line voltage (e.g., 2.0V), the unselected word line may be biased to an unselected word line voltage (e.g., 1.0V), the selected word line may be biased to a selected word line voltage (e.g., 0V), and the unselected bit line may be biased to an unselected bit line voltage (e.g., 1V). In this case, the unselected memory cells sharing the selected word line will be biased to the voltage difference between the selected word line voltage and the unselected bit line voltage. In other embodiments, the memory array biasing scheme depicted in FIG. 5 may be reversed such that the selected bit line is biased to 0V, the unselected word line is biased to 0.4V, the selected word line is biased to 1V, and the unselected bit line is biased to 0.5V.

As depicted in FIG. 5, the SELB node of read/write circuit 502 may be electrically coupled to the selected bit line via column decoder 563. In one embodiment, column decoder 563 may correspond with column decoder 152 depicted in FIG. 1E. Transistor 562 couples (or electrically connects) node SELB to the Vsense node. The transistor 562 may comprise a low VT nMOS device. Clamp control circuit 564 controls the gate of transistor 562. The Vsense node is connected to reference current Iref and one input of sense amplifier 566. The other input of sense amplifier 566 receives Vref-read, which is the voltage level used for comparing the Vsense node voltage in read mode. The output of sense amplifier 566 is connected to the data out terminal and to data latch 568. Write circuit 560 is connected to node SELB, the Data In terminal, and data latch 568.

In one embodiment, during a read operation, read/write circuit 502 biases the selected bit line to the selected bit line voltage in read mode. Prior to sensing data, read/write circuit 502 will precharge the Vsense node to 2V (or some other voltage greater than the selected bit line voltage). When sensing data, read/write circuit 502 attempts to regulate the SELB node to the selected bit line voltage (e.g., 1V) via clamp control circuit 564 and transistor 562 in a source-follower configuration. If the current through the selected memory cell 550 is greater than the read current limit, Iref, then, over time, the Vsense node will fall below Vref-read (e.g., set to 1.5V) and the sense amplifier 566 will read out a data "0." Outputting a data "0" represents that the selected memory cell 550 is in a low resistance state (e.g., a SET state). If the current through the selected memory cell 550 is less than Iref, then the Vsense node will stay above Vref-read and the sense amplifier 566 will read out a data "1." Outputting a data "1" represents that the selected memory cell 550 is in a high resistance state (e.g., a RESET state). Data latch 568 may latch the output of sense amplifier 566 after a time period of sensing the current through the selected memory cell (e.g., after 400 ns).

In one embodiment, during a write operation, if the Data In terminal requests a data "0" to be written to a selected memory cell, then read/write circuit 502 may bias SELB to the selected bit line voltage for programming a data "0" in write mode (e.g., 1.2V for a SET operation) via write circuit 560. The duration of programming the memory cell may be a fixed time period (e.g., using a fixed-width programming pulse) or variable (e.g., using a write circuit 560 that senses whether a memory cell has been programmed while programming). If the Data In terminal requests a data "1" to be written, then read/write circuit 502 may bias SELB to the selected bit line voltage for programming a data "1" in write mode (e.g., 0V or −1.2V for a RESET operation) via write circuit 560. In some cases, if a selected memory cell is to maintain its current state, then the write circuit 560 may bias SELB to a program inhibit voltage during write mode. The program inhibit voltage may be the same as or close to the unselected bit line voltage.

A NAND string may include a drain-side select transistor, such as select gate 470 in FIG. 4A, a source-side select transistor, such as select gate 471 in FIG. 4A, and one or more memory cell transistors in series between the drain-side select transistor and the source-side select transistor, such as transistors 472-475 in series between the first select gate 470 and the second select gate 471 in FIG. 4A. A select transistor may comprise either a drain-side select transistor or a source-side select transistor. In one embodiment, a select transistor may comprise a drain-side select transistor. In another embodiment, a select transistor may comprise a source-side select transistor.

Figure 6A:
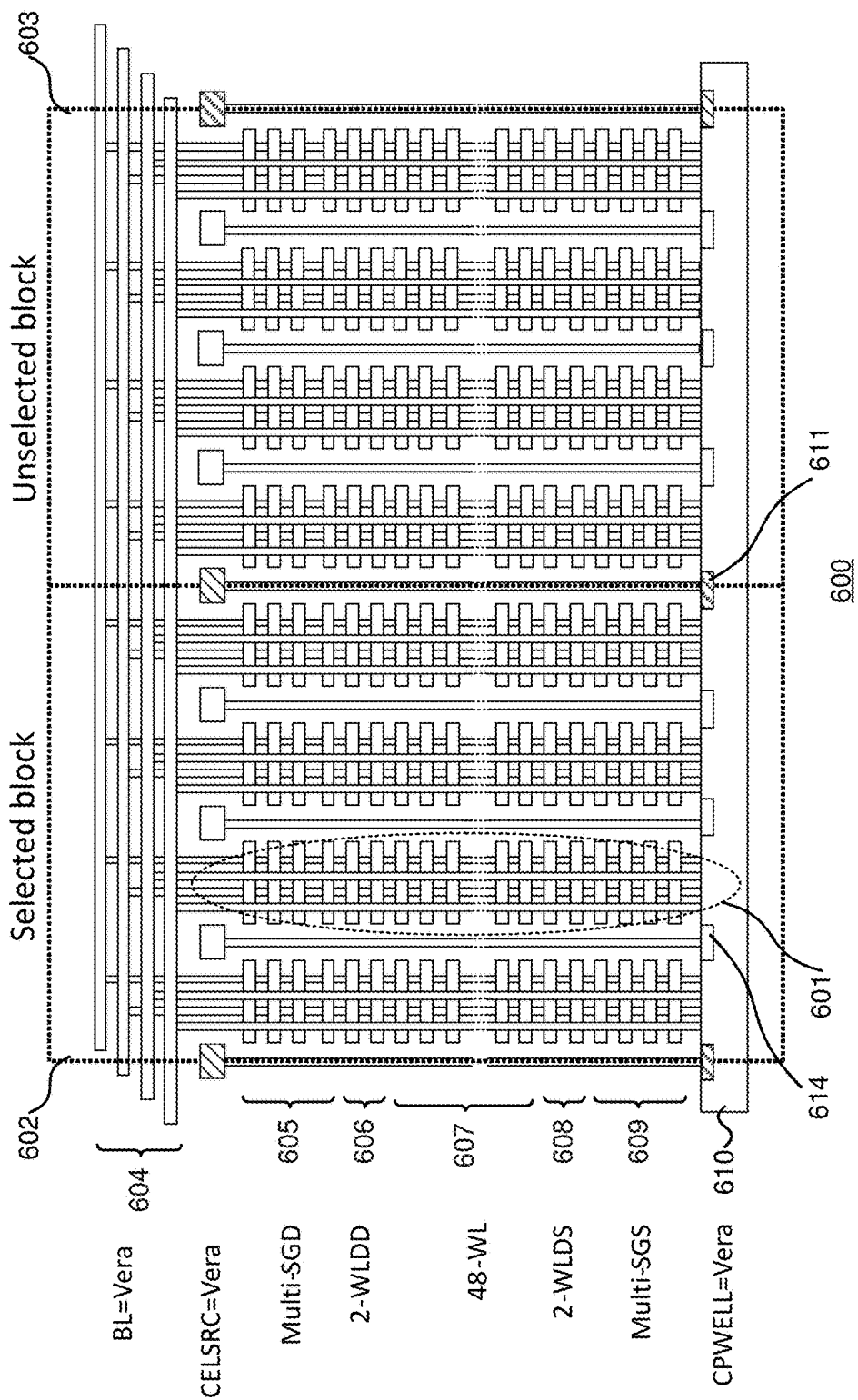
FIG. 6A depicts one embodiment of a memory array that includes a plurality of vertical NAND strings.

FIG. 6A depicts one embodiment of a memory array 600 that includes a plurality of vertical NAND strings. In one embodiment, the NAND strings may comprise floating gate transistors. In another embodiment, the NAND strings may comprise charge trap transistors. The plurality of vertical NAND strings includes a grouping of four NAND strings 601 that all share the same sets of word line fingers, drain-side select gate lines, and source-side select gate lines. The memory array 600 includes groupings of drain-side select gate lines corresponding with Multi-SGD lines 605, two dummy word lines 2-WLDD 606, two dummy word lines 2-WLDS 608, 48 word lines 48-WL 607, and source-side select gate lines corresponding with Multi-SGS lines 609. In one example, the grouping of four NAND strings 601 includes a first NAND string with a first drain-side select gate connected to a bit line of bit lines 604 at the top of the first NAND string. As depicted, the first drain-side select gate may comprise four transistors giving the first drain-side select gate an effective channel length that is four times that of the individual transistors. The number of transistors comprising the drain-side select gate may be greater than or less than four transistors (e.g., three transistors or five transistor). The first NAND string also includes 48 memory cell transistors, two dummy transistors on the drain-side of the memory cell transistors, two dummy transistors on the source-side of the memory cell transistors, and a first source-side select gate connected to a source line 614 near the bottom of the first NAND string.

As depicted, a selected memory block 602 may comprise four different groupings of vertical NAND strings, wherein the grouping of four NAND strings 601 is one of the four groupings. Each grouping of the four groupings of vertical NAND strings may share the same set of word line fingers. In one example, a particular word line finger may connect to the gates of four memory cell transistors associated with four different NAND strings in a grouping. For a given word line layer, each of the four groupings of vertical NAND strings may connect to different word line fingers. In some cases, each of the word line fingers within a memory block may be physically shorted together. The word line fingers may be shorted together using metal within the word line layer for the word line fingers. An unselected memory block 603 may comprise another four groupings of vertical NAND strings. Between the selected memory block 602 and the unselected memory block 603 may be a CPWELL contact 611 to the PWELL 610.

Figure 6D:
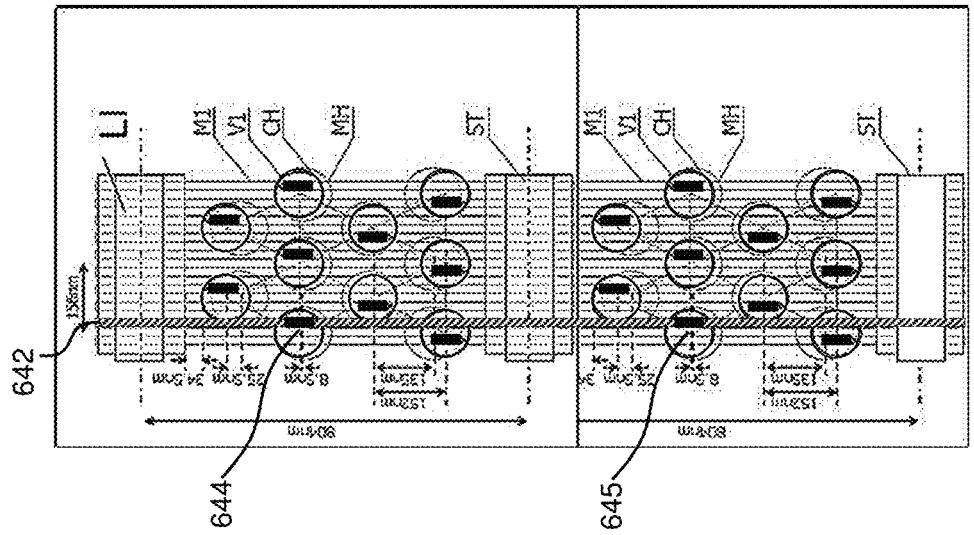
FIG. 6D depicts one embodiment of a top view for a portion of the memory array depicted in FIG. 6A.
Figure 6B:
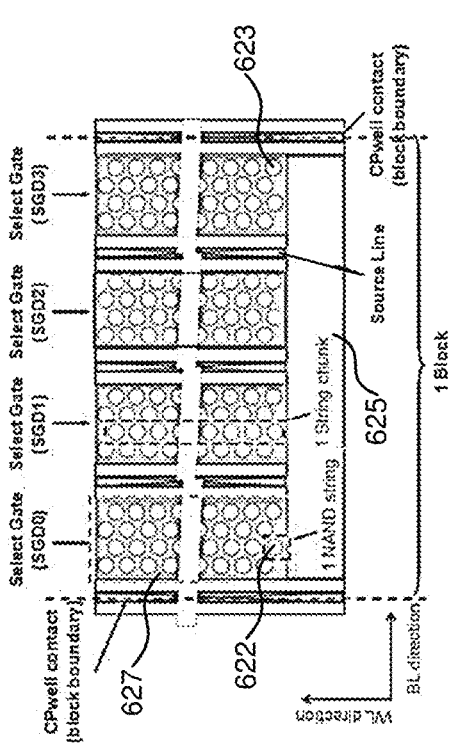
FIG. 6B depicts one embodiment of a top plan view for a portion of the memory array depicted in FIG. 6A.

FIG. 6B depicts one embodiment of a top plan view for a portion of the memory array 600 depicted in FIG. 6A. As depicted, a first vertical NAND string 622 is one of a first set of vertical NAND strings connected to a first word line finger 627 in a word line layer. A second vertical NAND string 623 is one of a second set of vertical NAND strings connected to a second word line finger in the word line layer. The first word line finger 627 is physically shorted to the second word line finger via metal connection 625. The first set of vertical NAND strings connects to a first drain-side select gate line (SGDO) and the second set of vertical NAND strings connects to a second drain-side select gate line (SGD3). The sets of vertical NAND strings connected to the four word line fingers in the word line layer may correspond with a single memory block.

Figure 6C:
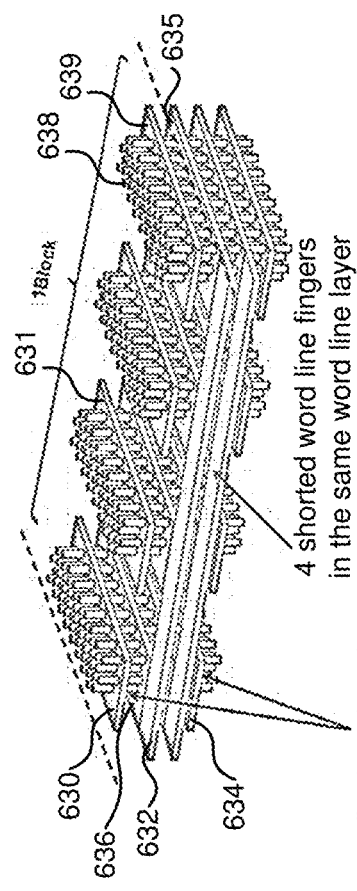
FIG. 6C depicts one embodiment of a front perspective for a portion of the memory array depicted in FIG. 6A.

FIG. 6C depicts one embodiment of a front perspective for a portion of the memory array 600 depicted in FIG. 6A. As depicted, a memory block may comprise four groups of vertical NAND strings. Each grouping of NAND strings of the four groups may connect to individual drain-side select gate fingers and/or individual source-side select gate fingers. For example, a first grouping of NAND strings may be connected to a first drain-side select gate finger 630 and a first source-side select gate finger 634. Within a particular metal layer, the first grouping of NAND strings may be connected to the first drain-side select gate finger 630 and a second grouping of NAND strings may be connected to the second drain-side select gate finger 631. A third drain-side select gate finger 639 may be arranged within the same metal layer as the first drain-side select gate finger 630 and the second drain-side select gate finger 631. The first drain-side select gate finger 630 may be arranged within a routing layer (or metal layer) that is arranged above the routing layer used for the first source-side select gate finger 634. A physical short 632 may short or electrically connect word line fingers within a word line layer. For example, physical short 632 may electrically connect or short word line finger 635 to word line finger 636. Both the word line finger 635 and the word line finger 636 may be arranged within the same word line layer. A vertical NAND string 638 intersects or is connected to one or more word line fingers including word line finger 635.

FIG. 6D depicts one embodiment of a top view for a portion of the memory array 600 depicted in FIG. 6A. As depicted, a bit line 642 connects to a first vertical NAND string 644 connected to a first word line finger and a second vertical NAND string 645 connected to a second word line finger. In one example, the first vertical NAND string 644 may correspond with one of the vertical NAND strings connected to word line finger 635 in FIG. 6C, such as vertical NAND string 638 in FIG. 6C. In the event that both the first word line finger and the second word line finger are physically shorted together, then a first drain-side select gate of the first vertical NAND string may be biased differently than a second drain-side select gate of the second vertical NAND string. For example, the first drain-side select gate may be set into a conducting state while the second drain-side select gate is set into a non-conducting state. In one embodiment, the first vertical NAND string 622 and the second vertical NAND string 623 in FIG. 6B may be connected to a common bit line running horizontally.

In one embodiment, during an erase operation for an entire memory block, an erase voltage (e.g., 20V) may be applied to the PWELL 610 while the word lines 606-608 are biased to ground (e.g., 0V). In this case, holes from the PWELL 610 may be injected into the channels of the selected NAND strings causing the channels to be biased towards or at the erase voltage. Due to the voltage or potential difference between the channels and the gates of the memory cell transistors, holes from the channels may be injected into the charge trap layers and recombine with electrons to erase the memory cell transistors. The select gate transistors (e.g., the drain-side select transistors and/or the source-side select transistors) may be floated during the erase operation.

In another embodiment, a partial block erase operation may be performed on a portion of a memory block to erase memory cells connected to one or more select gate fingers less than all of the select gate fingers for the entire memory block. The select gate fingers may correspond with either drain-side select gate fingers or source-side select gate fingers. In one example, a partial block erase operation may be performed to erase memory cells connected to two select gate fingers out of four select gate fingers (e.g., memory cells associated with NAND strings connected to the first drain-side select gate finger 630 in FIG. 6C and the second drain-side select gate finger 631 in FIG. 6C may be erased while other memory cells associated with other NAND strings connected to other drain-side select gates, such as the third drain-side select gate finger 639, are not erased). The NAND strings connected to the other unselected select gate fingers may be erase inhibited by biasing the gates of their drain-side select transistors to the erase voltage or to a voltage that is between the erase voltage and a particular voltage less than the erase voltage (e.g., within 3V of the erase voltage).

In one embodiment, a partial block erase operation may be performed from the drain side of a NAND string. In one example, an erase voltage (e.g., 20V) may be applied to a selected bit line connected to a first drain-side select transistor of a first NAND string and the gate of the first drain-side select transistor may be set to the erase voltage or to a voltage close to the erase voltage (e.g., within 2V of the erase voltage) to prevent erasing of memory cells connected to the first NAND string. Referring to FIG. 6C, a bit line connected to the vertical NAND string 638 in FIG. 6C may be set to the erase voltage while the third drain-side select gate finger 639 in FIG. 6C is set to the erase voltage (e.g., 20V) or to a voltage between the erase voltage and a particular voltage less than the erase voltage (e.g., within 3V of the erase voltage or between 17V and 20V). The channel material of the first NAND string may comprise crystalline silicon.

In another embodiment, a partial block erase operation may be performed from the source side of a NAND string. In one example, an erase voltage (e.g., 20V) may be applied to a PWELL that is connected to the source and channel of a first source-side select transistor of a first NAND string. The gate of the first source-side select transistor may be set to the erase voltage or to a voltage close to the erase voltage (e.g., within 2V of the erase voltage) to prevent holes injection from the PWELL into the first NAND string, hence to prevent raising the potential of the channel in the first NAND string, and consequently to prevent erasing of memory cells connected to the first NAND string. Referring to FIG. 6C, a PWELL (e.g., PWELL 610 in FIG. 6A) may be biased to the erase voltage while the first source-side select gate finger 634 in FIG. 6C is set to the erase voltage (e.g., 20V) or to a voltage between the erase voltage and a particular voltage less than the erase voltage (e.g., within 3V of the erase voltage or between 17V and 20V). The channel material of the first NAND string may comprise crystalline silicon.

Figure 6E:
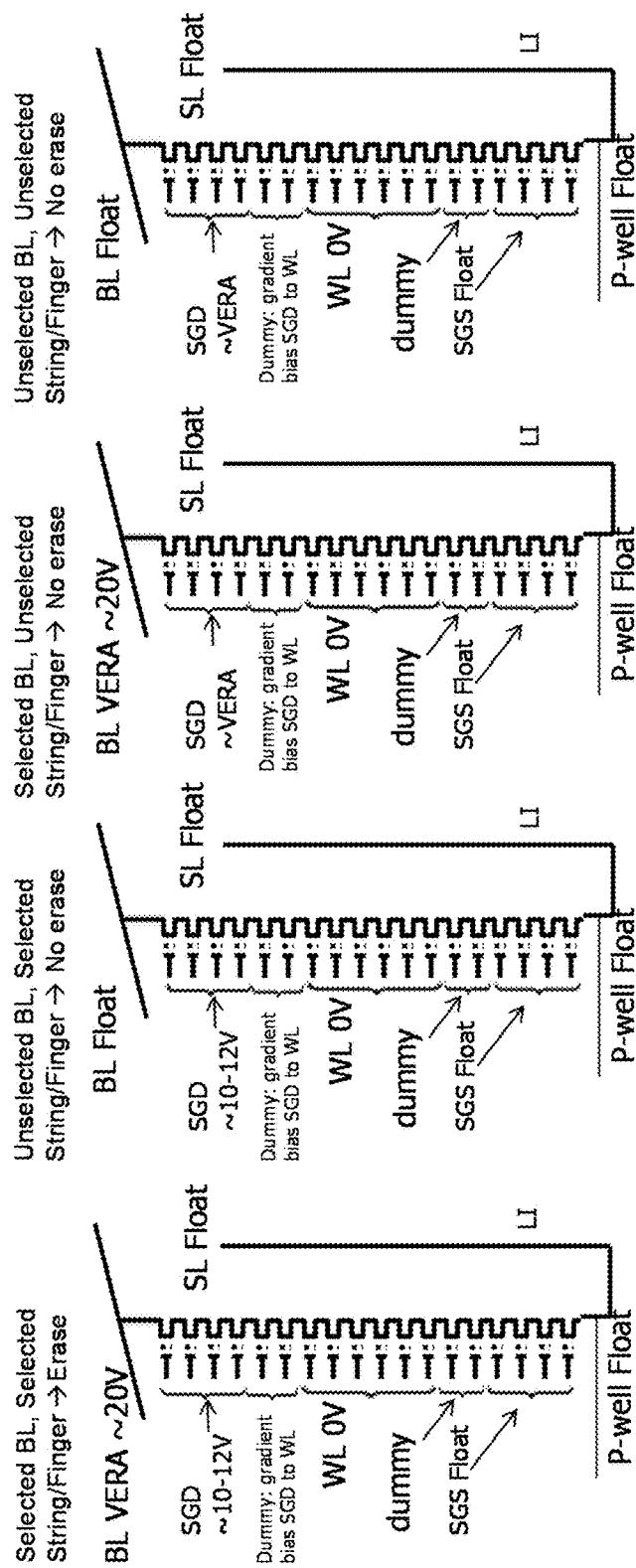
FIG. 6E depicts one embodiment of biasing conditions for NAND strings in a memory block during a partial block erase operation.

FIG. 6E depicts one embodiment of biasing conditions for NAND strings in a memory block during a partial block erase operation. For a first set of NAND strings connected to a selected bit line and a selected select gate finger, the selected bit line may be set to the erase voltage (e.g., 20V or 18V), the drain-side select gates may be biased to a voltage between 10V and 12V, the word lines may be set to 0V, the source-side select gates may be floated, and the source line connected to the source-side select gates may be floated. The drain-side dummy word lines may be biased to voltages between the 10-12V applied to the drain-side select gates and the 0V applied to the word lines (e.g., a drain-side select gate may be biased to 10V, a first drain-side dummy word line closest to the drain-side select gate may be biased to 8V, and a second drain-side dummy word line closest to the word lines may be biased to 3V). In this case, memory cells associated with the first set of NAND strings may be erased via a gate induced drain leakage (GIDL) current that occurs within the channels of the first set of NAND string during the partial block erase operation. The amount of GIDL current may be set or adjusted based on a voltage difference between the selected bit line voltage and the voltage applied to the gates of the drain-side select gates.

The nature of GIDL current is related to carrier generation, e.g. due to band-to-band tunneling. In one example, band-to-band tunneling may occur in the NAND string channel in the vicinity of a select gate electrode when the potential difference between the select gate and drain is high. As in the example above, the selected bit line may be set to the erase voltage of 20V. Since the drain-side select gate transistor drain is coupled to the bit line, its drain will also be biased to 20V. The drain-side select gate may be biased to a voltage between 10V and 12V, hence the potential difference between drain-side select gate transistor gate and drain may be between 10V and 8V. Such potential difference may induce band-to-band generation at the edge of the gate and drain of drain-side select gate transistor. As a result, electron-hole pairs may be generated resulting in GIDL current. Electrons may be extracted by an electric field toward the positively biased drain (bit-line). At the same time, by electric field action, holes may move into the channel. With sufficient GIDL current, the holes injected in the channel may raise its potential close to the erase voltage, e.g. close to 20V. With word lines set to 0V, erase may occur due to the high potential difference between channel and word lines. In one example, the potential difference between the select gate transistor gate and drain is low, e.g. bit line is biased to erase voltage of 20V, and drain-side select gate transistor gate is biased to a high voltage close to erase voltage, e.g. 18-20V. In this case, no or little band-to-band tunneling will occur, resulting in no or little GIDL current. In this case, the channel potential may not rise due to an insufficient number of holes that are generated and injected into the channel. Therefore, erase will not occur or will be inhibited. Thus, the amount of GIDL current may be set or adjusted based on a voltage difference between the selected bit line voltage and the voltage applied to the gates of the drain-side select gates.

For a second set of NAND strings connected to an unselected bit line and the selected select gate finger, the unselected bit line may be floated, the drain-side select gates may be biased to a voltage between 10V and 12V, the word lines may be set to 0V, the source-side select gates may be floated, and the source line connected to the source-side select gates may be floated. For a third set of NAND strings connected to a selected bit line and an unselected select gate finger, the selected bit line may be set to the erase voltage (e.g., 20V or 18V), the drain-side select gates may be biased to the erase voltage, the word lines may be set to 0V, the source-side select gates may be floated, and the source line connected to the source-side select gates may be floated. The drain-side dummy word lines may be biased to voltages between the 18V-20V applied to the drain-side select gates and the 0V applied to the word lines (e.g., a first drain-side dummy word line closest to the drain-side select gate may be biased to 12V and a second drain-side dummy word line closest to the word lines may be biased to 5V). A gradual reduction in the bias on dummy word lines in the direction from SG toward data WLs may be done to reduce the electric field between the select gate (set at a high bias) and word lines (set at a low bias), hence reducing carrier generation between SG and WLs and eliminating erase disturb in the erase-inhibited string. For this purpose, one, two or more dummy word lines can be used. For a fourth set of NAND strings connected to an unselected bit line and the unselected select gate finger, the unselected bit line may be floated, the drain-side select gates may be biased to the erase voltage, the word lines may be set to 0V, the source-side select gates may be floated, and the source line connected to the source-side select gates may be floated. Under these biasing conditions, only memory cells associated with the first set of NAND strings connected to a selected bit line and a selected select gate finger may be erased, while memory cells associated with the second set, third set, and fourth set of NAND strings may be erase inhibited (i.e., not erased).

In one embodiment, the channel material for a NAND string may be crystalline silicon (c-Si). The carrier generation rate for a crystalline silicon channel may be substantially lower than that of a polysilicon channel due to a much smaller number of defects and/or traps. For instance, trap-assisted carrier generation, hence overall carrier generation rate, can be much lower in crystalline silicon as compared to polysilicon. Therefore, erase disturb may be significantly reduced in the case of a crystalline silicon channel. Hence, partial block erase can be made more efficient in the case of channel material with reduced carrier generation.

Figure 7:
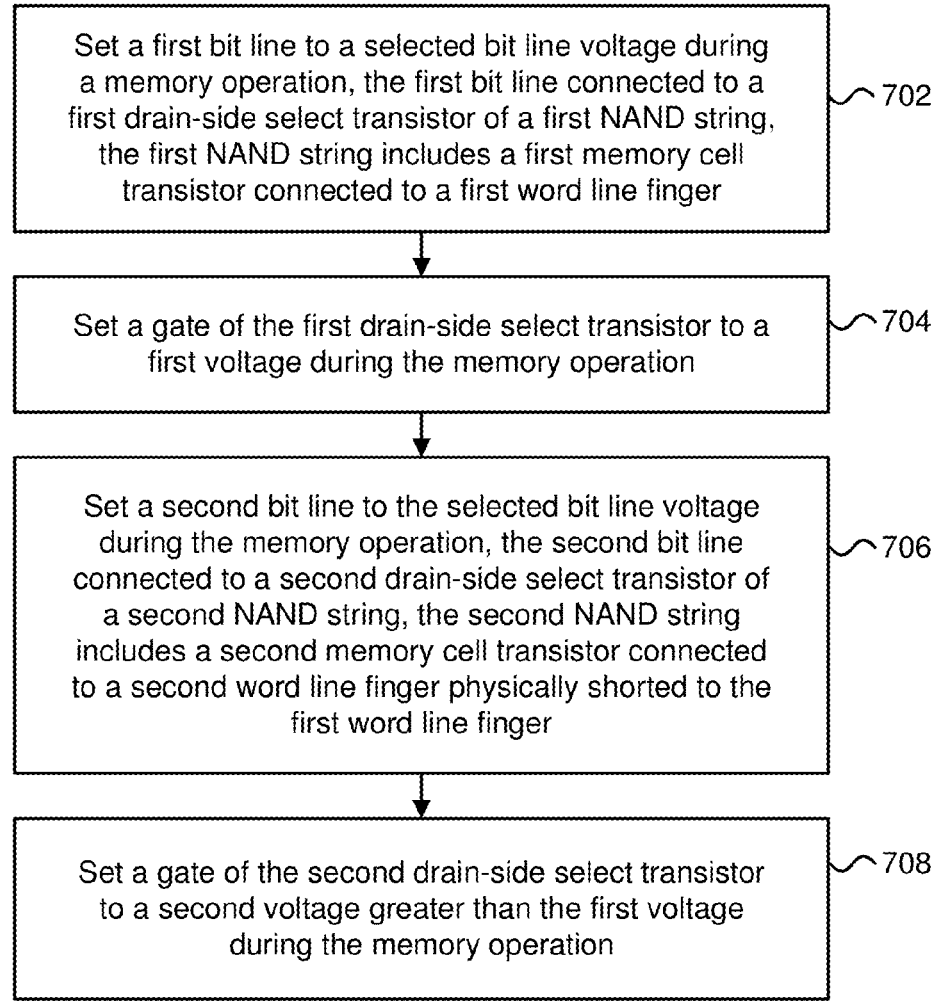
FIG. 7 is a flowchart describing one embodiment of a process for performing a partial block erase operation on a portion of a memory block.

FIG. 7 is a flowchart describing one embodiment of a process for performing a partial block erase operation on a portion of a memory block. In one embodiment, the process of FIG. 7 may be performed by a memory chip controller, such as the memory chip controller 105 depicted in FIG. 1A. A memory block may correspond with the memory array 600 depicted in FIG. 6A.

In step 702, the first bit line is set to a selected bit line voltage (e.g., to an erase voltage or 20V) during a memory operation. The memory operation may comprise an erase operation or a partial block erase operation. The first bit line may be connected to a first drain-side select transistor of a first NAND string. The first drain-side select transistor may comprise one or more transistors connected in series between the first bit line and one or more memory cell transistors of the first NAND string. The first NAND string may include a first memory cell transistor of the one or more memory cell transistors connected to a first word line finger. In one example, the first NAND string may correspond with the first vertical NAND string 622 in FIG. 6B and the first word line finger may correspond with the first word line finger 627 in FIG. 6B. The first word line finger 627 may comprise a wire or sheet of metal (e.g., a tungsten or aluminum finger) that includes a plurality of holes corresponding with a plurality of NAND strings, such as the first vertical NAND string 622, that extends through the word line finger.

In step 704, a gate of the first drain-side select transistor is set to a first voltage during the memory operation (e.g., 8V less than the erase voltage). In step 706, a second bit line is set to the selected bit line voltage during the memory operation. The second bit line may be connected to a second drain-side select transistor of a second NAND string. The second NAND string may include a second memory cell transistor connected to a second word line finger that is physically shorted to the first word line finger. In step 708, a gate of the second drain-side select transistor is set to a second voltage greater than the first voltage during the memory operation. In one example, the selected bit line voltage may comprise 20V, the first voltage may comprise 10V, and the second voltage may comprise 18V or 20V. The amount of GIDL current within the first NAND string may be set or adjusted based on a voltage difference between the selected bit line voltage and the first voltage applied to the first drain-side select transistor.

In some embodiments, a gate of a first drain-side select transistor is set to a first voltage during a memory operation and a gate of a second drain-side select transistor is set to a second voltage different from the first voltage during the memory operation. In some cases, the memory operation may comprise an erase operation, a programming operation, or a read operation and the first voltage may be applied such that the first drain-side select transistor is set into a conducting state during the memory operation and the second voltage may be applied such that the second drain-side select transistor is set into a non-conducting state during the memory operation. In other cases, the first voltage may be applied to the gate of the first drain-side select transistor such that a gate induced drain leakage (GIDL) current occurs within a channel of a first NAND string associated with the first drain-side select transistor during the memory operation and the second voltage may be applied to the gate of the second drain-side select transistor such that a gate induced drain leakage (GIDL) current does not occur within a channel of a second NAND string associated with the second drain-side select transistor during the memory operation.

In one embodiment, the voltage difference between the selected bit line voltage and the first voltage applied to the first drain-side select transistor may be set or increased based on a temperature of a memory die or based on the number of word line fingers used during a partial block erase operation. The number of word line fingers used during a partial block erase operation may be set or increased based on a temperature of a memory die. In one example, if the temperature is below a threshold temperature, then memory cells connected to a first set of word line fingers may be erased. However, if the temperature is greater than or equal to the threshold temperature, then memory cells connected to a second set of word line fingers greater than the first set of word line fingers may be erased.

One embodiment of the disclosed technology includes a first NAND string including a first memory cell transistor and a first select transistor, a second NAND string including a second memory cell transistor and a second select transistor, and a control circuit. A gate of the first memory cell transistor is connected to a first word line. The first select transistor is connected to a first bit line. The gate of the second memory cell transistor is connected to a second word line physically shorted to the first word line. The second select transistor is connected to a second bit line. The control circuit configured to set the first bit line and the second bit line to a selected bit line voltage during a memory operation. The control circuit configured to set a gate of the first select transistor to a first voltage during the memory operation and set a gate of the second select transistor to a second voltage different from the first voltage during the memory operation.

One embodiment of the disclosed technology includes setting a first bit line to a selected bit line voltage during a memory operation. The first bit line connected to a first select transistor of a first NAND string. The first NAND string includes a first memory cell transistor connected to a first word line. The method further comprises setting a gate of the first select transistor to a first voltage during the memory operation and setting a second bit line to the selected bit line voltage during the memory operation. The second bit line connected to a second select transistor of a second NAND string. The second NAND string includes a second memory cell transistor connected to the first word line. The method further comprises setting a gate of the second select transistor to a second voltage different from the first voltage during the memory operation.

One embodiment of the disclosed technology includes a first NAND string, a second NAND string, and a control circuit. The first NAND string includes a first memory cell transistor and a first drain-side select transistor. A gate of the first memory cell transistor connected to a first word line finger. The first drain-side select transistor connected to a first bit line. The second NAND string including a second memory cell transistor and a second drain-side select transistor. A gate of the second memory cell transistor connected to a second word line finger physically shorted to the first word line finger. The second drain-side select transistor connected to a second bit line. The control circuit configured to set the first bit line and the second bit line to a selected bit line voltage during a memory operation. The control circuit configured to set a gate of the first drain-side select transistor to a first voltage during the memory operation and set a gate of the second drain-side select transistor to a second voltage different from the first voltage during the memory operation.

One embodiment of the disclosed technology includes a first NAND string, a second NAND string, and a control circuit. The first NAND string including a first memory cell transistor and a first select transistor. A gate of the first memory cell transistor connected to a first word line. The first select transistor connected to a first bit line. The second NAND string including a second memory cell transistor and a second select transistor. A gate of the second memory cell transistor connected to a second word line physically shorted to the first word line. The second select transistor connected to the first bit line. The control circuit configured to set the first bit line to a selected bit line voltage during a memory operation. The control circuit configured to set a gate of the first select transistor to a first voltage during the memory operation and set a gate of the second select transistor to a second voltage different from the first voltage during the memory operation.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a first NAND string including a first memory cell transistor in series with a first select transistor, a gate of the first memory cell transistor connected to a first word line, the first select transistor connected to a first bit line;
a second NAND string including a second memory cell transistor in series with a second select transistor, a gate of the second memory cell transistor connected to a second word line physically shorted to the first word line, the second select transistor connected to the first bit line; and
a control circuit configured to set the first bit line to a selected bit line voltage at a first point in time during a memory operation, the control circuit configured to set a gate of the first select transistor to a first voltage at the first point in time and set a gate of the second select transistor to a second voltage different from the first voltage at the first point in time.

2. The apparatus of claim 1, wherein:
the first NAND string comprises a crystalline silicon channel.

3. The apparatus of claim 1, wherein:
the first select transistor is set into a conducting state at the first point in time and the second select transistor is set into a non-conducting state at the first point in time.

4. The apparatus of claim 1, wherein:
the first voltage is at least a transistor threshold voltage of the first select transistor less than the second voltage.

5. The apparatus of claim 1, wherein:
the memory operation comprises an erase operation; and
the control circuit configured to set a first voltage difference between the gate of the first select transistor and the first bit line such that a gate induced drain leakage current occurs within a channel of the first NAND string during the erase operation.

6. The apparatus of claim 1, further comprising:
a third NAND string including a third memory cell transistor and a third select transistor, a gate of the third memory cell transistor connected to the first word line, the third select transistor connected to a third bit line.

7. The apparatus of claim 6, wherein:
the control circuit configured to float the third bit line during the memory operation.

8. The apparatus of claim 6, wherein:
the control circuit configured to set a gate of the third select transistor to the first voltage during the memory operation.

9. The apparatus of claim 1, further comprising:
a third NAND string including a third memory cell transistor and a third select transistor, a gate of the third memory cell transistor connected to the first word line, the third select transistor connected to a third bit line, the control circuit configured to set the third bit line to the selected bit line voltage during the memory operation.

10. The apparatus of claim 1, wherein:
the first NAND string comprises a vertical NAND string; and
the first select transistor comprises a first drain-side select transistor.

11. The apparatus of claim 1, wherein:
the first NAND string includes a first source-side select transistor; and
the second NAND string includes a second source-side select transistor, the control circuit configured to float a gate of the first source-side select transistor and a gate of second source-side select transistor during the memory operation.

12. An apparatus, comprising:
a first NAND string including a first memory cell transistor in series with a first select transistor, a gate of the first memory cell transistor connected to a first word line finger, a drain of the first select transistor directly connected to a first bit line;
a second NAND string including a second memory cell transistor in series with a second select transistor, a gate of the second memory cell transistor connected to a second word line finger that is physically shorted to the first word line finger, a drain of the second select transistor directly connected to the first bit line; and
one or more control circuits configured to set a gate of the first select transistor to a first voltage at a first point in time during a memory operation and set a gate of the second select transistor to a second voltage different from the first voltage at the first point in time.

13. The apparatus of claim 12, wherein:
the first select transistor is set into a conducting state at the first point in time and the second select transistor is set into a non-conducting state at the first point in time.

14. The apparatus of claim 12, wherein:
the first voltage is at least a transistor threshold voltage of the first select transistor less than the second voltage.

15. The apparatus of claim 12, wherein:
the memory operation comprises an erase operation.

16. The apparatus of claim 12, further comprising:
a third NAND string including a third memory cell transistor in series with a third select transistor, a gate of the third memory cell transistor connected to the first word line finger, the third select transistor connected to a third bit line.

17. The apparatus of claim 16, wherein:
the one or more control circuits configured to float the third bit line during the memory operation.

18. The apparatus of claim 16, wherein:
the one or more control circuits configured to set a gate of the third select transistor to the first voltage during the memory operation.

19. The apparatus of claim 12, wherein:
the first NAND string comprises a vertical NAND string.

* * * * *